(12) United States Patent
Yoo et al.

(10) Patent No.: US 9,183,138 B2
(45) Date of Patent: Nov. 10, 2015

(54) ENCODING PROGRAM DATA BASED ON DATA STORED IN MEMORY CELLS TO BE PROGRAMMED

(71) Applicants: Younggeon Yoo, Seoul (KR); Junjin Kong, Yongin-si (KR); Changkyu Seol, Osan-si (KR); Hong Rak Son, Anyang-si (KR); Hyunseuk Yoo, Hwaseong-si (KR)

(72) Inventors: Younggeon Yoo, Seoul (KR); Junjin Kong, Yongin-si (KR); Changkyu Seol, Osan-si (KR); Hong Rak Son, Anyang-si (KR); Hyunseuk Yoo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 100 days.

(21) Appl. No.: 14/053,893

(22) Filed: Oct. 15, 2013

(65) Prior Publication Data

US 2014/0115237 A1  Apr. 24, 2014

(30) Foreign Application Priority Data

Oct. 23, 2012  (KR) .................... 10-2012-0118019

(51) Int. Cl.
*G06F 12/02* (2006.01)
*G11C 16/10* (2006.01)
*G11C 13/00* (2006.01)

(52) U.S. Cl.
CPC ............ *G06F 12/0246* (2013.01); *G11C 16/10* (2013.01); *G11C 13/0069* (2013.01); *G11C 2013/0076* (2013.01)

(58) Field of Classification Search
CPC .................... G11C 13/0069; G11C 2013/0076

USPC .......................................................... 710/62
See application file for complete search history.

(56) References Cited

U.S. PATENT DOCUMENTS

| 6,862,235 | B2 | 3/2005 | Sakata et al. | |
|---|---|---|---|---|
| 7,106,621 | B2 | 9/2006 | Frey | |
| 7,298,642 | B2 | 11/2007 | Ise | |
| 7,542,356 | B2 * | 6/2009 | Lee et al. | 365/189.07 |
| 7,768,823 | B2 | 8/2010 | Kang et al. | |
| 7,783,846 | B2 | 8/2010 | Chainer | |
| 7,796,427 | B2 | 9/2010 | Kim et al. | |
| 7,817,462 | B2 | 10/2010 | Miura et al. | |
| 7,876,626 | B2 * | 1/2011 | Mukai et al. | 365/189.14 |
| 7,920,413 | B2 | 4/2011 | Yu et al. | |
| 8,001,337 | B2 | 8/2011 | Tanaka | |
| 2011/0276857 | A1 | 11/2011 | Kim et al. | |
| 2011/0280065 | A1 | 11/2011 | Rao et al. | |

FOREIGN PATENT DOCUMENTS

| JP | 2006-172672 A | 6/2006 |
|---|---|---|
| JP | 2008059717 A | 3/2008 |
| KR | 10-2008-0081656 A | 9/2008 |
| KR | 10-2009-0034572 A | 4/2009 |

\* cited by examiner

*Primary Examiner* — Chun-Kuan Lee
(74) *Attorney, Agent, or Firm* — Volentine & Whitt, PLLC

(57) ABSTRACT

A method of programming data in a nonvolatile memory device comprises receiving program data to be programmed in selected memory cells of the nonvolatile memory device, reading data from the selected memory cells, encoding the program data using at least one encoding scheme selected from among multiple encoding schemes according to a comparison of the program data and the read data, generating flag data including encoding information, and programming the encoded program data and the flag data in the selected memory cells.

30 Claims, 25 Drawing Sheets

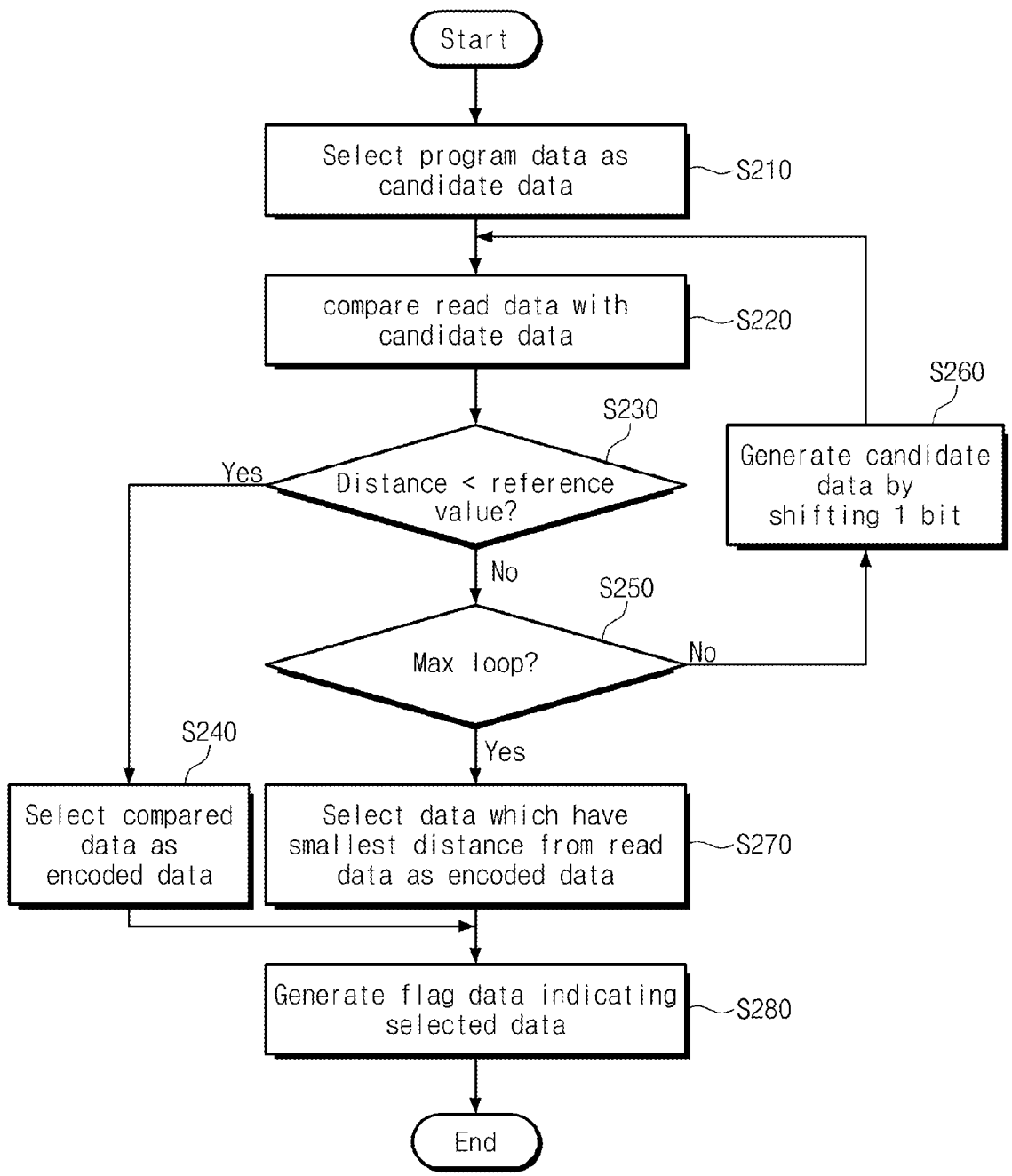

Fig. 7A

| | Data | Difference | Distance | Flag Data |
|---|---|---|---|---|
| Read Data | 11110000 | | | |
| Program Data | 10101111 | 01011111 | 6 | 00 |
| 1st Candidate Data (1bit Shifted) | 01011111 | 10101111 | 6 | 01 |
| 2nd Candidate Data (2bit Shifted) | 10111110 | 01001110 | 4 | 10 |
| 3rd Candidate Data (3bit Shifted) | 01111101 | 10001101 | 4 | 11 |

Fig. 7B

| | Data | Difference | Distance | Flag Data |
|---|---|---|---|---|
| Read Data | FF.1A.0C.CC.32.2B.98.52.3A.EE | | | |
| Program Data | FE.92.1A.0C.82.24.2B.91.0C.AA | 1111111111 | 10 | 00 |
| 1st Candidate Data (1bit Shifted) | 92.1A.0C.82.24.2B.91.0C.AA.FE | 1001101111 | 7 | 01 |
| 2nd Candidate Data (2bit Shifted) | 1A.0C.82.24.2B.91.0C.AA.FE.92 | 1111111111 | 10 | 10 |
| 3rd Candidate Data (3bit Shifted) | 0C.82.24.2B.91.0C.AA.FE.92.1A | 1111111111 | 10 | 11 |

Fig. 7C

Simulation Result Using 2-bit Flag data

| N(Length) | 8 | 16 | 24 | 32 |
|---|---|---|---|---|
| Program Data | 4 | 8 | 12 | 16 |
| Encoded Data | 3.7 | 6.9 | 10.5 | 13.1 |

Fig. 7D

Simulation Result Using 4-bit Flag data

| N(Length) | 64 | 128 | 256 | 512 |
|---|---|---|---|---|
| Program Data | 32 | 64 | 128 | 256 |
| Encoded Data | 27 | 56 | 115.6 | 238.3 |

Fig. 9

|  | Data | Difference | Distance | Flag Data |
|---|---|---|---|---|
| Read Data | 11110000 | | | |
| Program Data | 10101111 | 01011111 | 6 | 0 |
| Candidate Data | 11111000 | 00001000 | 1 | 1 |

Fig. 11

|  | Data | Difference | Distance | Flag Data |
|---|---|---|---|---|
| Read Data | 11110000 | | | |
| Preset Data | 01010000 | | | |
| Program Data | 10101111 | 01011111 | 6 | 0 |
| Candidate Data | 11111000 | 00001000 | 4 | 1 |

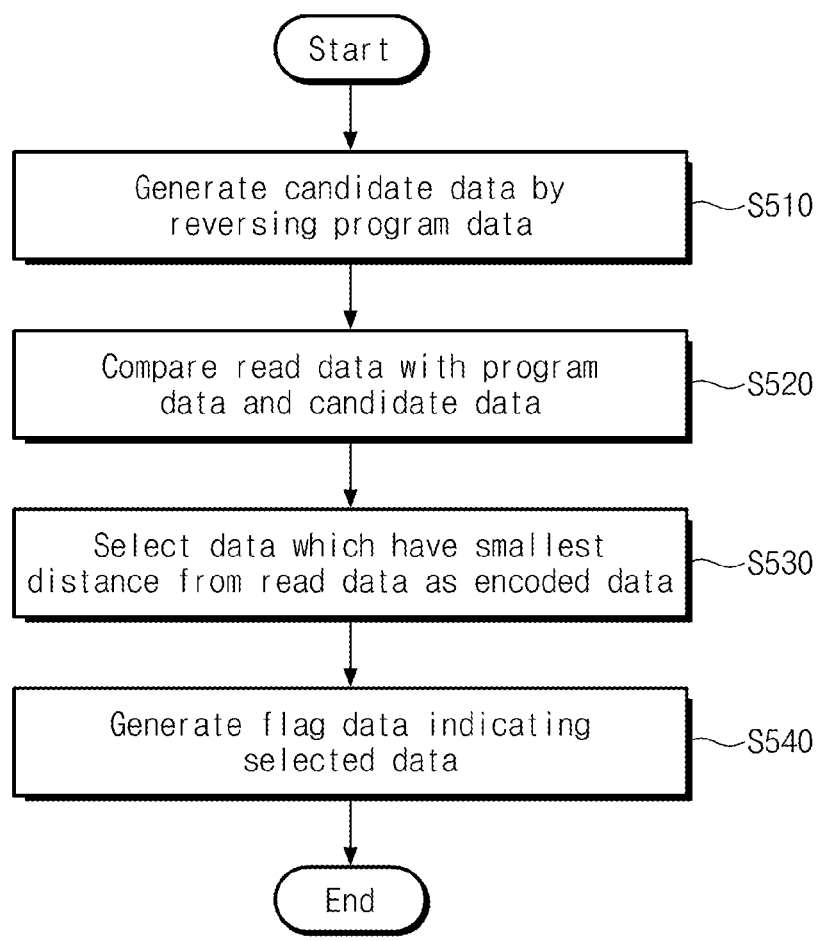

Fig. 13A

|  | Data | Difference | Distance | Flag Data |
|---|---|---|---|---|
| Read Data | 11110000 |  |  |  |
| Program Data | 10101111 | 01011111 | 6 | 0 |
| Candidate Data | 01010000 | 10100000 | 2 | 1 |

Fig. 13B

|  | Data | Difference | Distance | Flag Data |
|---|---|---|---|---|
| Read Data | 11110000 |  |  |  |
| Program Data | 10101111 | 01011111 | 6 | 00 |
| 1st Candidate Data (1st Part Reversed) | 01011111 | 10101111 | 6 | 01 |
| 2nd Candidate Data (2nd Part Reversed) | 10100000 | 01010000 | 2 | 10 |
| 3rd Candidate Data (All Reversed) | 01010000 | 10100000 | 2 | 11 |

ENCODING PROGRAM DATA BASED ON DATA STORED IN MEMORY CELLS TO BE PROGRAMMED

CROSS-REFERENCE TO RELATED APPLICATIONS

This application claims priority under 35 U.S.C. §119 to Korean Patent Application No. 10-2012-0118019 filed Oct. 23, 2012, the subject matter of which is hereby incorporated by reference.

BACKGROUND OF THE INVENTION

The inventive concept relates generally to semiconductor memory devices, and more particularly, to a memory system comprising a nonvolatile memory device and a controller and a method for programming data in the nonvolatile memory device.

Semiconductor memory devices can be roughly divided into two categories according to whether they retain data when disconnected from power. These categories include volatile memory devices, which lose stored data when disconnected from power, and nonvolatile memory devices, which retain stored data when disconnected from power. Examples of volatile memory devices include static random access memory (SRAM), dynamic random access memory (DRAM), and synchronous DRAM (SDRAM). Examples of nonvolatile memory devices include read only memory (ROM), programmable ROM (PROM), electrically programmable ROM (EPROM), electrically erasable and programmable ROM (EEPROM), flash memory device, a phase-change RAM (PRAM), magnetic RAM (MRAM), resistive RAM (RRAM), and ferroelectric RAM (FRAM).

There is a continuing demand for nonvolatile memory devices to have improved performance characteristics, such as faster operating speed and lower power consumption, for instance. To address this demand, researchers have sought improvements in both the physical and operational characteristics of the devices.

SUMMARY OF THE INVENTION

In one embodiment of the inventive concept, a method of programming data in a nonvolatile memory device comprises receiving program data to be programmed in selected memory cells of the nonvolatile memory device, reading data from the selected memory cells, encoding the program data using at least one encoding scheme selected from among multiple encoding schemes according to a comparison of the program data and the read data, generating flag data including encoding information, and programming the encoded program data and the flag data in the selected memory cells.

In another embodiment of the inventive concept, a method of programming a memory comprises receiving program data to be programmed in selected memory cells of the memory, reading data from the selected memory cells, dividing the program data into multiple program data groups and the read data into multiple read data groups, encoding each of the program data groups using at least one encoding scheme selected from among multiple encoding schemes according to a comparison between each program data group and a corresponding read data group, generating encoded data by combining the encoded program data groups, generating flag data comprising encoding information for each of the program data groups, and programming the encoded data and the flag data in the selected memory cells.

In yet another embodiment of the inventive concept, a method of programming a memory comprises receiving program data to be programmed in selected memory cells, reading data from the selected memory cells, selecting the program data as candidate data, comparing the program data with the candidate data, based on the comparison, selecting the candidate data as encoded data where a distance between the candidate data and the read data is less than a reference value, generating additional candidate data via circular shift of the candidate data where a distance between the candidate data and the read data is greater than the reference value, and again performing the comparing and selecting encoded data according to the comparison or the additional candidate data, generating flag data comprising information about the number of bits of the encoded data shifted from the program data, and programming the encoded data and the flag data at the memory cells of the memory.

In yet another embodiment of the inventive concept, a memory system comprises a memory, and a controller configured to control the memory, wherein the controller comprises, a random access memory, a host interface configured to receive program data from an external device and to store the program data at the random access memory, a memory interface configured to receive data read from the memory and to store the read data at the random access memory, a data encoding unit configured to encode the program data stored at the random access memory based on the read data stored at the random access memory and to store the encoded data at the random access memory, and a processor configured to control the memory interface to program the encoded data of the random access memory at the memory. The data encoding unit is further configured to generate the encoded data according to a comparison between the read data and the program data.

In yet another embodiment of the inventive concept, a method of programming a memory comprises receiving program data to be programmed in selected memory cells, reading data from the selected memory cells, dividing the program data into first and second portions, generating first candidate data by reversing the first portion of the program data, generating second candidate data by reversing the second portion of the program data, selecting data having a smallest distance from the read data among the first and second candidate data as encoded data, generating flag data comprising information about the selected data, and programming the encoded data and the flag data in the selected memory cells.

These and other embodiments of the inventive concept can potentially reduce the amount of power consumed in program operations by reducing the number of bits that are changed in those operations.

BRIEF DESCRIPTION OF THE DRAWINGS

The drawings illustrate selected embodiments of the inventive concept. In the drawings, like reference numbers indicate like features.

FIG. 6A is a flowchart illustrating a method of programming a nonvolatile memory device in which encoding is performed and flag data is generated, according to an embodiment of the inventive concept.

FIG. 7A is a diagram illustrating another application of the method of FIG. 6, according to an embodiment of the inventive concept.

FIG. 7B is a diagram illustrating yet another application of the method of FIG. 6, according to an embodiment of the inventive concept.

FIG. 7C is a diagram illustrating a simulation result of the method of FIG. 6 using 2-bit flag data, according to an embodiment of the inventive concept.

FIG. 7D is a diagram illustrating a simulation result of the method of FIG. 6 using 4-bit flag data, according to an embodiment of the inventive concept.

FIG. 9 is a diagram illustrating an application of the method of FIG. 8, according to an embodiment of the inventive concept.

FIG. 11 is a diagram illustrating an application of the method of FIG. 10, according to an embodiment of the inventive concept.

FIG. 12 is a flowchart illustrating still another method of programming a nonvolatile memory device in which encoding is performed and flag data is generated, according to an embodiment of the inventive concept.

FIG. 13A is a diagram illustrating an application of the method of FIG. 12, according to an embodiment of the inventive concept.

FIG. 13B is a diagram illustrating another application of the method of FIG. 12, according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

In the description that follows, the terms "first", "second", "third", etc., are used in describing various features, but the described features should not be limited by these terms. Rather, these terms are used merely to distinguish between different features. Thus, a first feature could be termed a second feature without departing from the relevant teachings.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. The terms "comprises" and/or "comprising," where used herein, indicate the presence of stated features but do not preclude the presence of other features. As used herein, the term "and/or" includes any and all combinations of one or more of the associated listed items.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
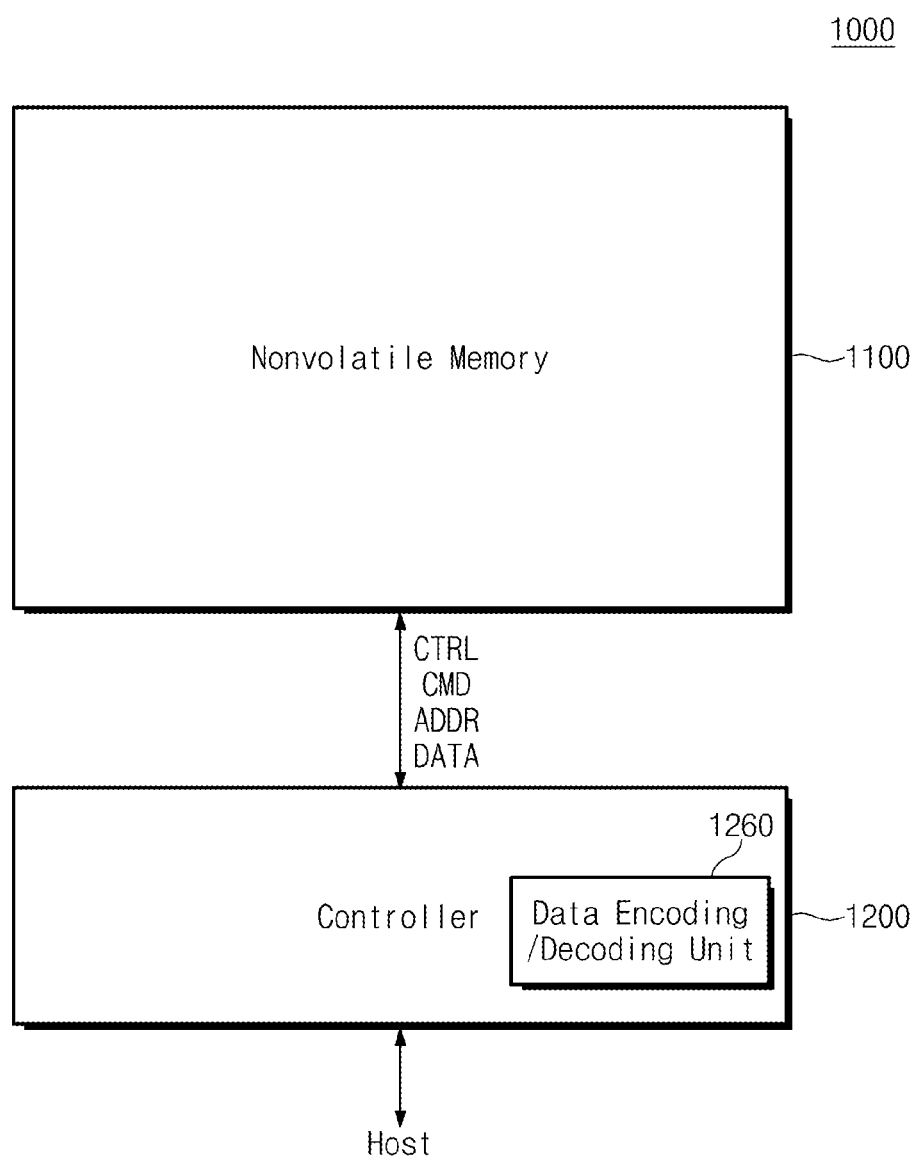
FIG. 1 is a block diagram illustrating a memory system, according to an embodiment of the inventive concept.

FIG. 1 is a block diagram illustrating a memory system according to an embodiment of the inventive concept.

Referring to FIG. 1, a memory system 1000 comprises a nonvolatile memory 1100 and a controller 1200.

Nonvolatile memory 1100 operates under control of controller 1200, and it performs programming, reading, and erasing in response to a control signal CTRL, a command CMD, an address ADDR, and data transferred from controller 1200. Nonvolatile memory 1100 may comprise, for instance, a nonvolatile random access memory. For example, it may comprise a phase-change RAM (PRAM), a magnetic RAM (MRAM), a resistive RAM (RRAM), a ferroelectric RAM (FRAM). Alternatively, nonvolatile memory 1100 may comprise a NAND flash memory.

Controller 1200 controls nonvolatile memory 1100, and it sends control signal CTRL, command CMD, address ADDR, and the data to nonvolatile memory 1100 or receives data from nonvolatile memory 1100. Controller 1200 typically controls nonvolatile memory 1100 under control of an external host.

Controller 1200 comprises a data encoding/decoding unit 1260. Data encoding/decoding unit 1260 is configured to encode data transferred from the host. The encoded data may be programmed at nonvolatile memory 1100. Data encoding/decoding unit 1260 is configured to decode data read from nonvolatile memory 1100. The decoded data is sent to the host.

In certain embodiments, nonvolatile memory 1100 stores data in memory cells by generating a current flow via conductive lines connected with the memory cells to change a logical state of the memory cells. The number of memory cells whose data varies at programming may a factor for determining power consumption of memory system 1000.

Data encoding/decoding unit 1260 encodes data such that power consumption in programming is reduced. For example, in a program operation, data encoding/decoding unit 1260 may encode data such that a difference between data to be stored at memory cells and data stored at the memory cells is minimized, as will be described in further detail below.

Although FIG. 1 shows an example in which data encoding/decoding unit 1260 is included as a component of controller 1200, the inventive concept is not limited thereto. For example, nonvolatile memory 1100 can alternatively be configured to include data encoding/decoding unit 1260. For ease of description, it is assumed that data encoding/decoding unit 1260 is included in controller 1200. However, the inventive concept is not limited thereto.

Memory system 1000 may be, for instance, a memory card such as a PC/PCMCIA card, a compact flash (CF) card, a smart media (SM) card (SMC), a memory stick, a multimedia card (MMC, RS-MMC, MMCmicro, etc.) an SD card (SD, miniSD, SDHC, etc.), universal flash storage (UFS), and so on. Alternatively, memory system 1000 may form a solid state drive (SSD). In some embodiments, memory system 1000 can be used as a main memory of a computer system.

Figure 2:
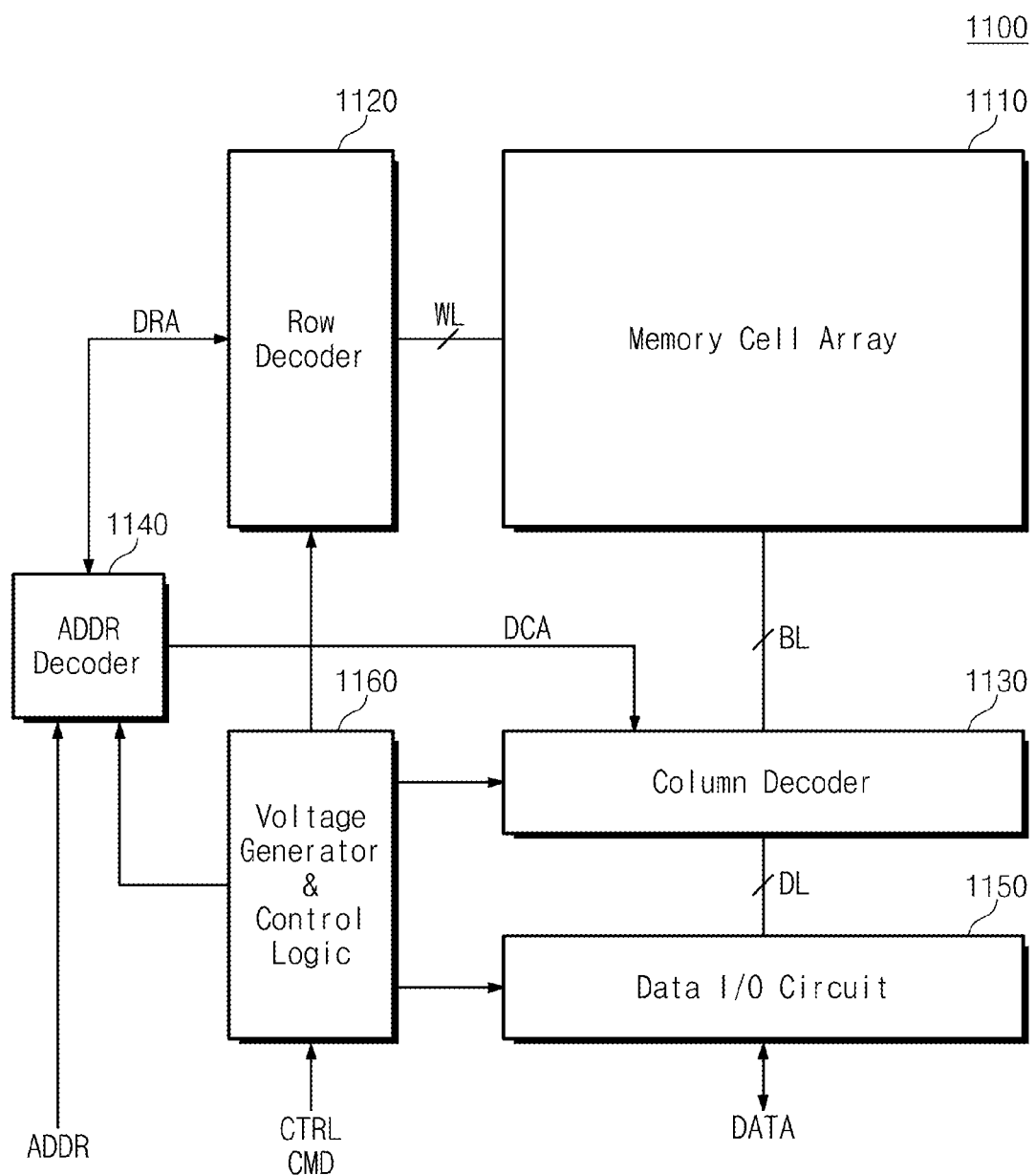
FIG. 2 is a block diagram illustrating a nonvolatile memory device, according to an embodiment of the inventive concept.

FIG. 2 is a block diagram illustrating a more detailed example of nonvolatile memory 1100 according to an embodiment of the inventive concept.

Referring to FIG. 2, nonvolatile memory 1100 comprises a memory cell array 1100, a row decoder 1120, a column decoder 1130, an address decoder 1140, a data input/output circuit 1150, and a voltage generator and control logic block 1160.

Memory cell array 1100 comprises multiple nonvolatile memory cells. The memory cells are connected with row decoder 1120 via word lines and with column decoder 1130 via bit lines. In some embodiments, rows of memory cells in memory cell array 1110 are connected with the word lines, and columns of memory cells therein are connected with the bit lines.

Row decoder 1120 is connected with memory cell array 1110 via the word lines, and it operates under control of voltage generator and control logic block 1160. Row decoder 1120 selects or unselects the word lines in response to a decoded row address DRA from address decoder 1140. Row decoder 1120 supplies at least one selected word line or unselected word lines with voltages provided from voltage generator and control logic block 1160.

Column decoder 1130 is connected with the memory cell array via the bit lines. Column decoder 1130 operates under control of voltage generator and control logic block 1160. Column decoder 1140 selects or unselects the bit lines in response to a decoded column address DCA from address decoder 1140. Column decoder 1130 supplies bit lines with voltages provided from voltage generator and control logic block 1160.

In some embodiments, column decoder 1130 receives and stores data via data lines DL. Column decoder 1130 selects or unselects the bit lines based on the stored data. Column decoder 1130 senses and stores voltages or currents of the bit lines. A sending result may be data read from memory cell array 1110. The read data is output via data lines DL.

Address decoder 1140 operates under control of voltage generator and control logic block 1160. Address decoder 1140 receives and stores an address ADDR from controller 1200. Address decoder 1140 decodes a row address of the stored address and sends the resulting decoded row address DRA to row decoder 1120. Address decoder 1140 decodes a column address of the stored address and sends the resulting decoded column address DCA to column decoder 1130.

Data input/output circuit 1150 operates under control of voltage generator and control logic block 1160. Data input/output circuit 1150 stores data transferred from controller 1200 to output it via data lines DL. Data input/output circuit 1150 stores data transferred via data lines DL and outputs it to controller 1200.

Voltage generator and control logic block 1160 is configured to receive a control signal CTRL and a command CMD from controller 1200. Voltage generator and control logic block 1160 is configured to control overall operations of nonvolatile memory 1100 in response to control signal CTRL and command CMD. For example, voltage generator and control logic block 1160 may supply voltages to constituent elements of nonvolatile memory 1100 and control operating timing of the constituent elements of nonvolatile memory 1100.

Figure 3A:
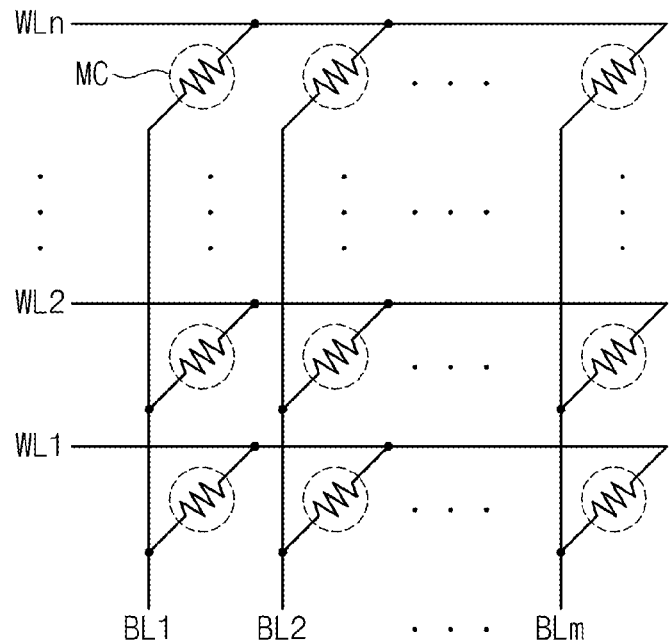
FIG. 3A is a circuit diagram illustrating a memory cell array, according to an embodiment of the inventive concept.
Figure 3B:
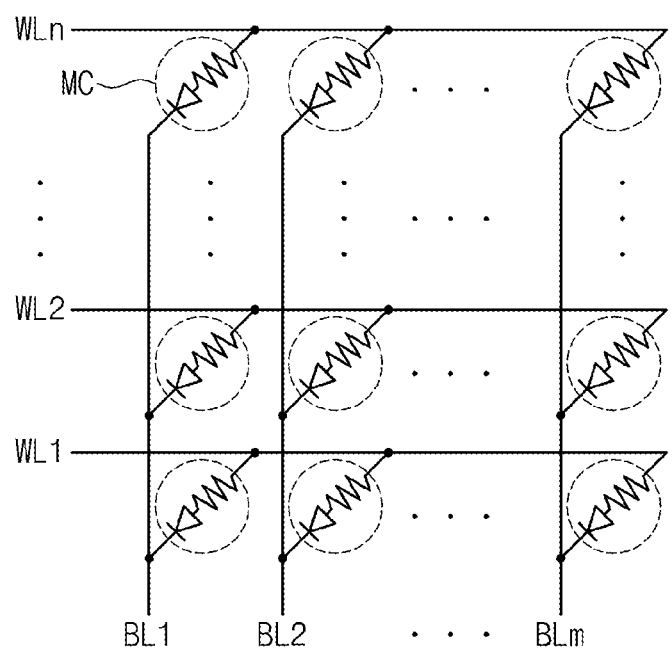
FIG. 3B is a circuit diagram illustrating a memory cell array, according to an embodiment of the inventive concept.
Figure 3C:
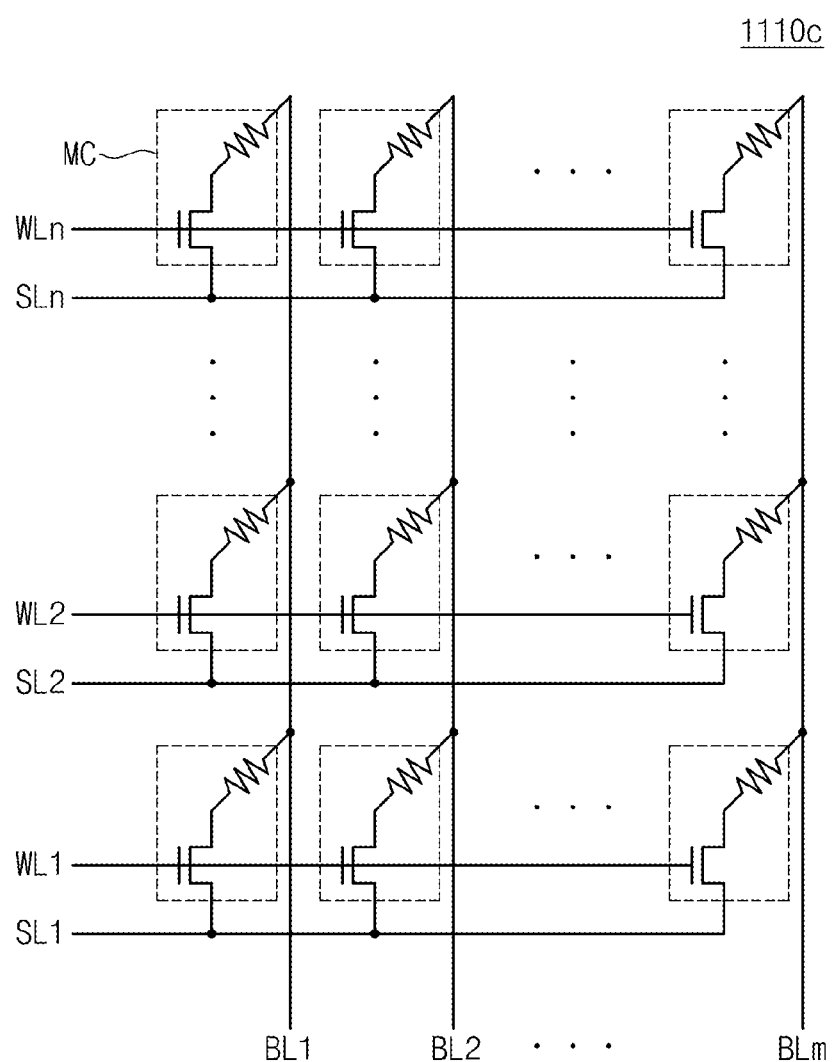
FIG. 3C is a circuit diagram illustrating a memory cell array, according to an embodiment of the inventive concept.

FIGS. 3A to 3C are circuit diagrams illustrating examples of memory cell array 1110 according to various embodiments of the inventive concept.

Referring to FIG. 3A, a memory cell array 1110a comprises memory cells MC connected with word lines WL1 to WLn and bit lines BL1 to BLm. Each of memory cells MC comprises a variable resistance element. The variable resistance element may have a resistance value that varies according to a temperature, a voltage or current condition, magnetic field arrangement, and so on. Memory cells MC are selected or unselected according to voltages of word lines WL1 to WLn and bit lines BL1 to BLm.

Referring to FIG. 3B, a memory cell array 1110b comprises memory cells MC connected with word lines WL1 to WLn and bit lines BL1 to BLm. Each of memory cells MC comprises a variable resistance element and a diode. The variable resistance element may have a resistance value that varies according to a temperature, a voltage or current condition, magnetic field arrangement, and so on. Where a diode is forward biased, a current flows through the diode. Where a diode is reversely biased, no current flows through the diode. The diodes make it possible to improve selectivity of memory cells MC according to voltages of word lines WL1 to WLn and bit lines BL1 to BLm. In some embodiments, locations and directions of the diodes are changed according to program, read, and erase schemes of a nonvolatile memory 1100.

Referring to FIG. 3C, a memory cell array 1110c comprises memory cells MC connected with word lines WL1 to WLn, source lines SL1 to SLn, and bit lines BL1 to BLm. Each of memory cells MC comprises a variable resistance element and a transistor. The variable resistance element may have a resistance value which varies according to a temperature, a voltage or current condition, magnetic field arrangement, and so on. The transistors are turned on or off according to voltages of word lines WL1 to WLn. The transistors may allow improvements in selectivity of memory cells MC.

In certain embodiments, locations and connection relations of the transistors are changed according to program, read, and erase schemes of nonvolatile memory 1100. Source lines SL1 to SLn are connected with row decoder 1120 or column decoder 1130.

Figure 4:
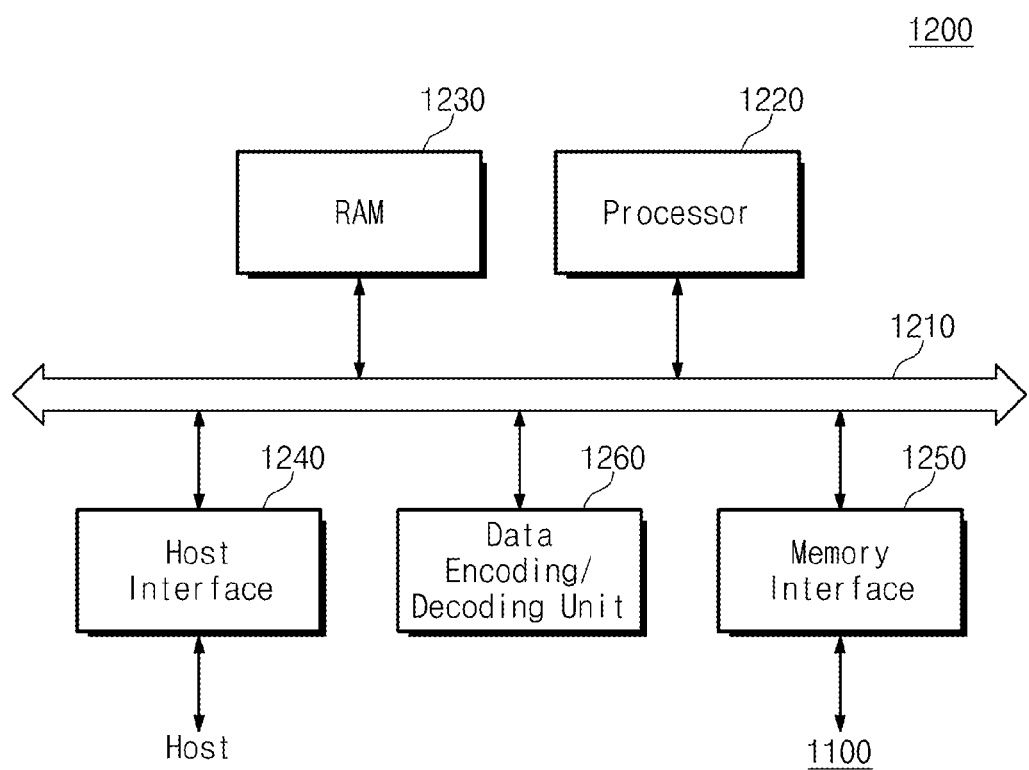
FIG. 4 is a block diagram illustrating a controller, according to an embodiment of the inventive concept.

FIG. 4 is a block diagram illustrating an example of controller 1200 according to an embodiment of the inventive concept.

Referring to FIG. 4, controller 1200 comprises a bus 1210, a processor 1220, a RAM 1230, a host interface 1240, a memory interface 1250, and a data encoding/decoding unit 1260.

Bus 1210 provides channels among constituent elements 1220 to 1260 of controller 1200. Controller 1220 controls constituent elements 1220 to 1260 of controller 1200. RAM 1230 is used as a working memory of processor 1220 or controller 1200. RAM 1230 may include DRAM, SRAM, FRAM, MRAM, PRAM, RRAM, and so on.

Host interface 1240 is configured to communicate with a host under control of processor 1220. Host interface 1240 communicates with the host using a communication standard such as, e.g., Universal Serial Bus (USB), multimedia card (MMC), peripheral component interconnection (PCI), PCI-express (PCI-E), Advanced Technology Attachment (ATA), Serial-ATA, Parallel-ATA, small computer small interface (SCSI), enhanced small disk interface (ESDI), Integrated Drive Electronics (IDE), and Firewire.

Memory interface 1250 communicates with nonvolatile memory 1100. Data encoding/decoding unit 1260 performs data encoding and decoding. For example, data encoding/decoding unit 1260 may encode data which is received via host interface 1240 from the host and is stored at RAM 1230. The encoded data is stored at RAM 1230 and sent from there to nonvolatile memory 1100 via memory interface 1250. Data encoding/decoding unit 1260 decodes data received via memory interface 1250 from nonvolatile memory device 1100 and stored at RAM 1230. The decoded data is stored at RAM 1230 to be sent to the host via host interface 1240.

Data encoding/decoding unit 1260 encodes data such that a variation in data of memory cells of nonvolatile memory 1100 is reduced. Data encoding/decoding unit 1260 generates information about the encoding. The information is sent to nonvolatile memory 1100 with the encoded data. Data encoding/decoding unit 1260 also receives encoding information with data from nonvolatile memory 1100, and it decodes the input data based on the encoding information.

Below, information regarding encoding generated by data encoding/decoding unit 1260 is referred to as flag data.

In certain embodiments, data encoding/decoding unit 1260 comprises a separate component from processor 1220. However, in some embodiments, data encoding/decoding unit 1260 can be included as a component of processor 1220. Data encoding/decoding unit 1260 is typically implemented by software driven by processor 1220. However, the inventive concept is not limited thereto.

Figure 5:
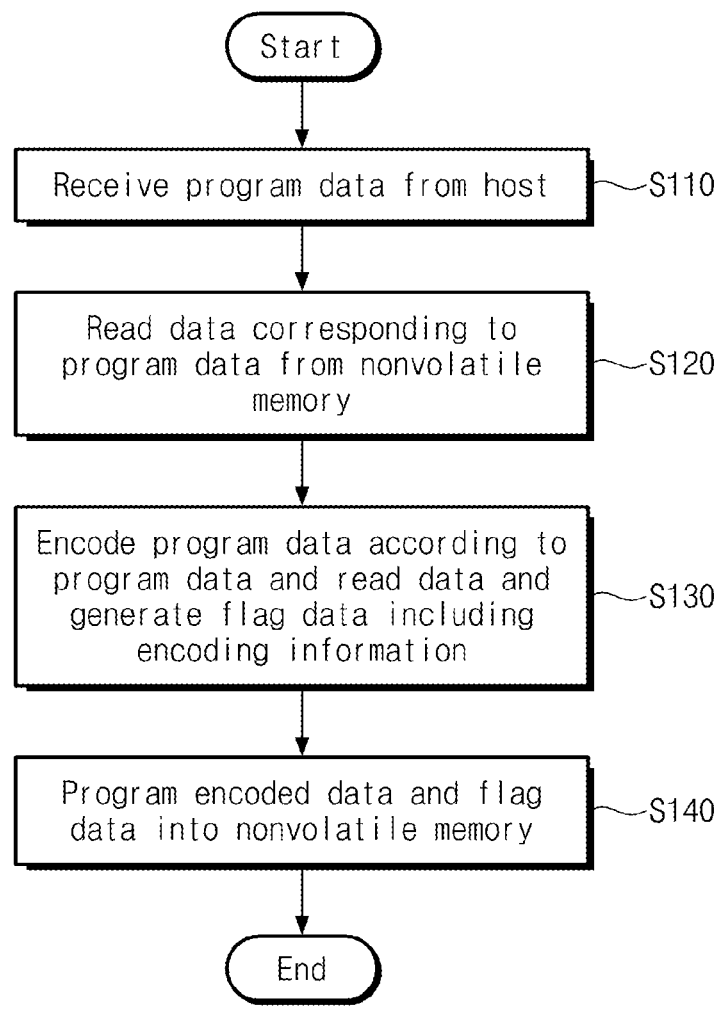
FIG. 5 is a flowchart illustrating a method of programming a nonvolatile memory device, according to an embodiment of the inventive concept.

FIG. 5 is a flowchart illustrating a method of programming a nonvolatile memory device according to an embodiment of the inventive concept.

Referring to FIGS. 1, 4, and 5, in operation S110, program data is received from a host. Controller 1200 receives the program data from the host via a host interface and stores it in RAM 1230.

In operation S120, data corresponding to the program data is read from nonvolatile memory 1100. For example, controller 1200 may read data from a storage area of nonvolatile memory 1100 where the program data is to be stored. Controller 1200 controls nonvolatile memory 1100 to perform a read operation using an address received with the program data. The read data is stored in RAM 1230 via a memory interface 1250.

In operation S130, the program data is encoded according the program data and the read data, and flag data including encoding information is generated. Next, data encoding/decoding unit 1260 compares the program data and the read data stored in RAM 1230. Data encoding/decoding unit 1260 encodes the program data in RAM 1230 according to a comparison result. Data encoding/decoding unit 1260 generates at least one unit of candidate data via encoding and compares the program data to the candidate data. Data encoding/decoding unit 1260 selects one of the candidate data and the program data as encoded data.

The encoded data is stored at RAM 1230. Where data encoding/decoding unit 1260 selects the program data as encoded data, an operating of storing the encoded data at RAM 1230 may be skipped. Where the encoded data is selected, data encoding/decoding unit 1260 generates flag data including encoding information. The flag data comprises information indicating whether any one of the candidate data and the program data is selected as encoded data. The flag data is stored at RAM 1230.

In operation S140, the encoded data and the flag data are stored in nonvolatile memory 1100. The encoded data and the flag data stored in RAM 1230 are sent to nonvolatile memory 1100 via memory interface 1250. Nonvolatile memory 1100 programs the received data in a storage area where the read data is stored, under control of controller 1200.

FIG. 6A is a flowchart illustrating a method of programming a nonvolatile memory device in which encoding is performed and flag data is generated, according to an embodiment of the inventive concept.

Referring to FIG. 6A, in operation S210, program data is selected as candidate data. In operation S220, read data is compared with the candidate data. For example, a distance between the read data and the candidate data may be compared. The distance may be the number of different bits between the read data and data compared with the read data.

In operation S230, a determination is made as to whether the distance is below a reference value. For example, it may be determined whether the distance between the read data and the candidate data is below the reference value. If the distance is below the reference value, in operation S240, the candidate data is selected as encoded data. Afterwards, the method proceeds to operation S280. If the distance is not below the reference value, the method proceeds to operation S250.

In operation S250, a determination is made as to whether a current loop reaches a max loop. A maximum loop number is set by data encoding/decoding unit 1260. The maximum loop number can be previously stored in controller 1200. The maximum loop number can be also set via a mode register of controller 1200. Where the current loop does not reach the max loop, in operation S260, new candidate data is generated by shifting previous candidate data by one bit. Afterwards, the method proceeds to operation S220. Where the current loop reaches the max loop, in operation S270, data having a smallest distance from the read data is selected as encoded data.

In operation S280, flag data indicating selected data is generated. For example, the flag data may comprise information about data, selected as encoded data, from among the candidate data and the program data. For example, the flag data may comprise information about the number of bits of the selected data which are shifted from the program data.

Figure 6B:
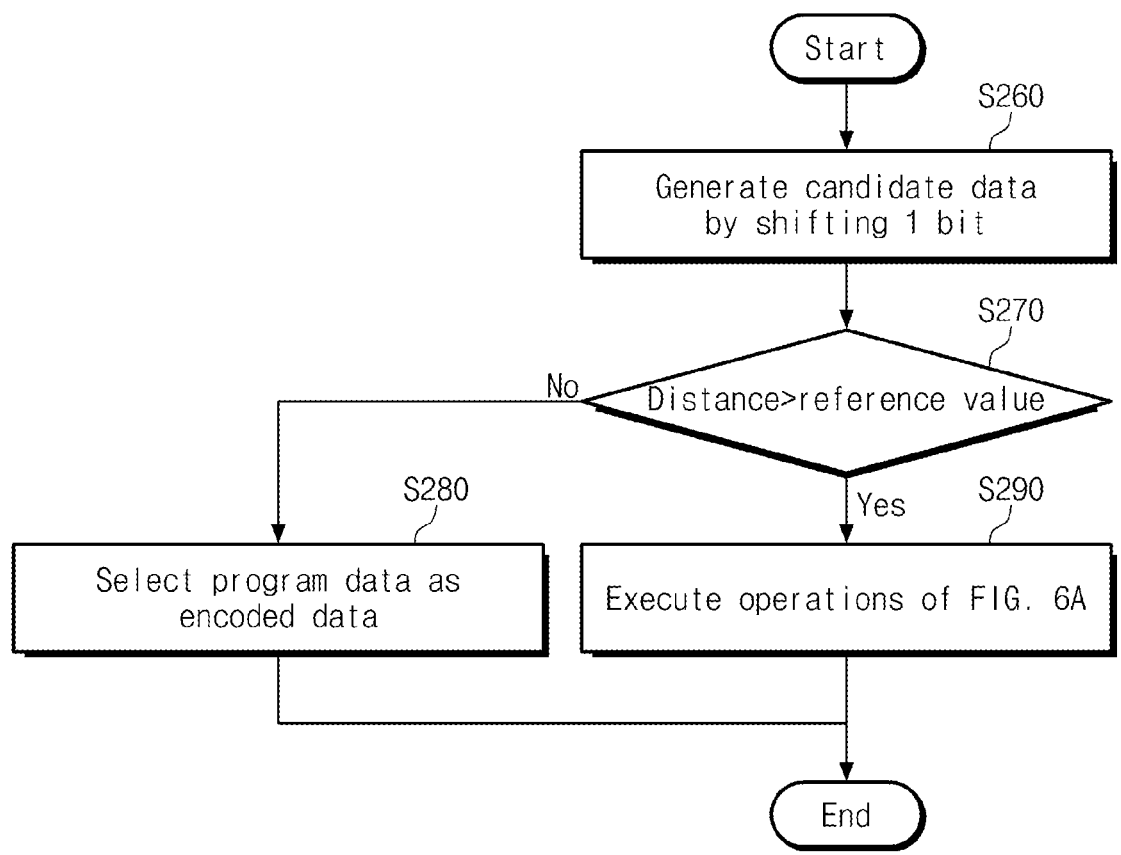
FIG. 6B is a flowchart illustrating an application of the method of FIG. 6A, according to an embodiment of the inventive concept.

FIG. 6B is a flowchart illustrating an application of the encoding method of FIG. 6A, according to an embodiment of the inventive concept.

Referring to FIG. 6B, in operation S260, a distance between read data and program data is calculated. In operation S270, a distance between the program data and the read data is compared with a reference value. If a distance between the program data and the read data is less than the reference value, in operation S280, the program data is selected as encoded data. If a distance between the program data and the read data is more than the reference value, in operation S290, an encoding method is performed according to a manner described with reference to FIG. 6A. That is, the encoding method of FIG. 6A is performed where a distance between the program data and the read data is more than the reference value.

FIG. 7A is a diagram illustrating an application of the method of FIG. 6, according to an embodiment of the inventive concept. In the example of FIG. 7A a max loop is 3 and a difference indicates a difference between read data and program data and candidate data. For example, where a bit of the read data corresponding to a specific location is equal to a bit of the program or candidate data, a difference bit of the specific location is "0". On the other hand, where a bit of the read data corresponding to a specific location is different from a bit of the program or candidate data, a difference bit of the specific location is "1".

Referring to FIGS. 1 and 7A, first candidate data is generated by shifting the program data by one bit. For example, the program data may be shifted to the left. Second candidate is generated by shifting the program data by two bits (or, shifting the candidate data by one bit). Third candidate is generated by shifting the program data by three bits (or, shifting the candidate data by one bit).

A distance between the program data and the read data is 6. Flag data indicating that the program data is selected as encoded data is "00". A distance between the first candidate data and the read data is 6. Flag data indicating that the first candidate data is selected as encoded data is "01". A distance between the second candidate data and the read data is 4. Flag data indicating that the second candidate data is selected as encoded data is "10". A distance between the third candidate data and the read data is 4. Flag data indicating that the third candidate data is selected as encoded data is "11".

Data having the smallest distance from the read data, i.e., one of the second and third candidate data is selected as encoded data. If the second candidate data is selected, flag data of "10" is generated. If the third candidate data is selected, flag data of "11" is generated.

A distance between the second or third candidate data and the read data is shorter than a distance between the program data and the read data. Six bits are changed when the program data is programmed at a nonvolatile memory 1100. That is, data of six memory cells is changed. On the other hand, four bits are changed when the second or third candidate data is programmed at nonvolatile memory 1100. That is, data of four memory cells is changed.

A reduction in the number of memory cells that are changed during a programming operation can reduce power consumption. Accordingly, the above method can potentially reduce the power consumption of a memory system 1000 is reduced. Such a reduction in power consumption may also make it is possible to reduce the size and complexity of memory system 1000.

FIG. 7B is a diagram illustrating another application of the method of FIG. 6, according to an embodiment of the inventive concept. In the example of FIG. 7B, a max loop is 3. Compared with FIG. 7A, comparing and shifting on read data, program data, and first to third candidate data is performed on a byte-by-byte basis. That is, an encoding method may be performed by the byte as well as by the bit.

FIG. 7C is a diagram illustrating a simulation result of the method of FIG. 6 using 2-bit flag data, according to an embodiment of the inventive concept. FIG. 7D is a diagram illustrating a simulation result of the method of FIG. 6 using 4-bit flag data, according to an embodiment of the inventive concept. In FIGS. 7C and 7D, the simulation results are based on a random data pattern.

Referring to FIGS., 7C, and 7D, the diagrams show the number of bits changed at programming of program data or at programming of encoded data according to length N of program data for circular shift encoding. As illustrated in FIGS. 7C and 7D, the number of bits changed at programming of encoded data is reduced in comparison with the case that program data is programmed in nonvolatile memory 1100. Thus, it is possible to reduce power consumption of memory system 1000 via an encoding method (or, a program method) according to an embodiment of the inventive concept.

Figure 8:
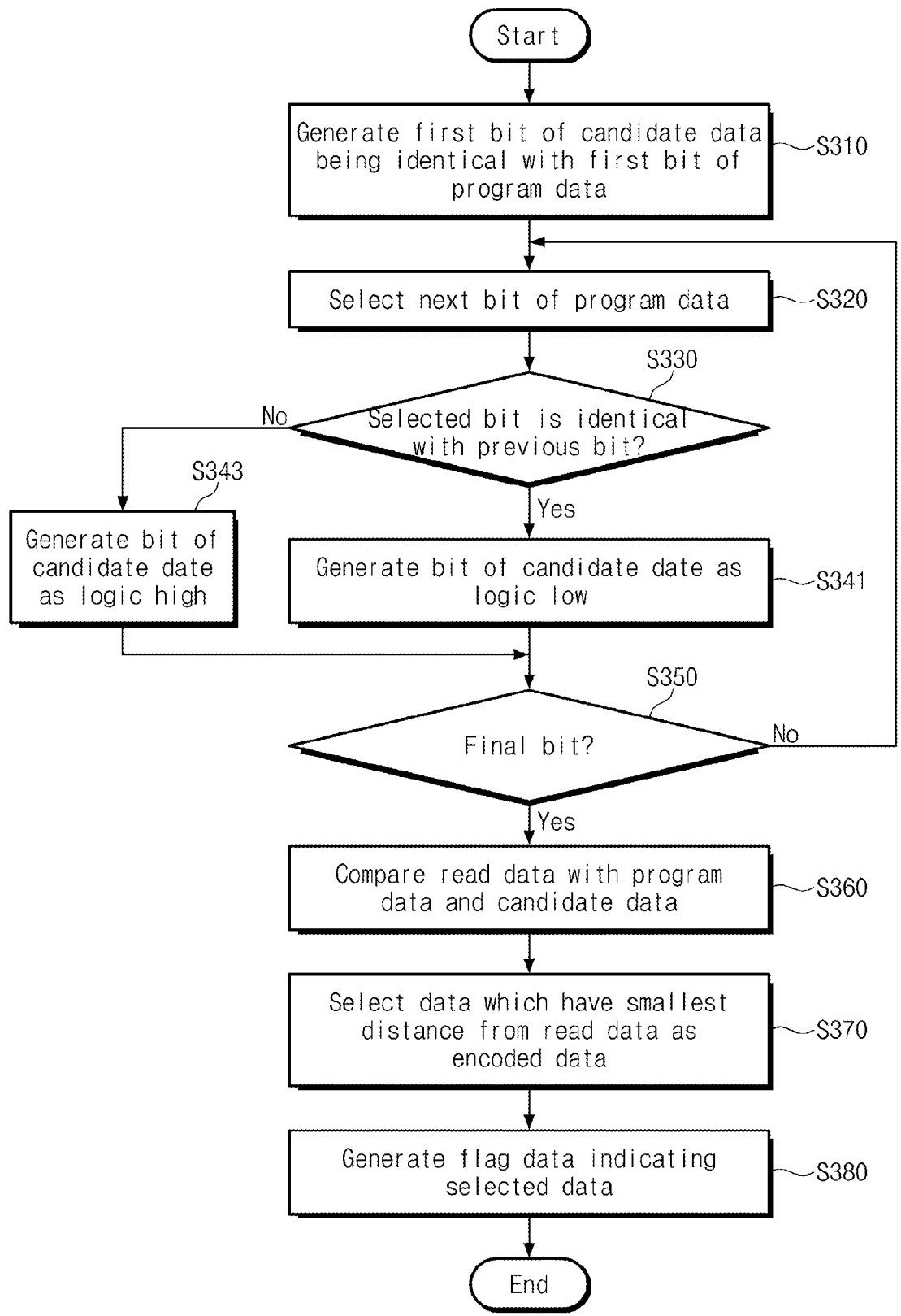
FIG. 8 is a flowchart illustrating another method of programming a nonvolatile memory device in which encoding is performed and flag data is generated, according to an embodiment of the inventive concept.

FIG. 8 is a flowchart illustrating a method of programming a nonvolatile memory device in which encoding is performed and flag data is generated, according to an embodiment of the inventive concept. The encoding illustrated in FIG. 8 is differential encoding.

Referring to FIG. 8, in operation S310, a first bit of candidate data is generated identical with a first bit of program data. For example, if a first bit of the program data is "0", a first bit of the candidate data is generated to have "0". On the other hand, if a first bit of the program data is "1", a first bit of the candidate data is generated as "1".

In operation S320, a next bit of the program bit is selected. In operation S330, a determination is made as to whether the selected bit is identical with a previous bit. For example, it may be determined whether the selected bit of the program data is identical with a previous bit. If the selected bit of the program data is "1" and the previous bit of the program data is "1", the selected bit of the program data is determined to be identical with the previous bit. If the selected bit of the program data is "0" and the previous bit of the program data is "0", the selected bit of the program data is determined to be identical with the previous bit. If the selected bit of the program data is "1" and the previous bit of the program data is "0", the selected bit of the program data is determined to be different from the previous bit. If the selected bit of the program data is "0" and the previous bit of the program data is "1", the selected bit of the program data is determined to be different from the previous bit.

If the selected bit of the program data is determined to be identical with the previous bit, in operation S341, a bit of the candidate bit is generated to have a logic low value (e.g., "0"). If the selected bit of the program data is determined to be different from the previous bit, in operation S343, a bit of the candidate bit is generated to have a logic high value (e.g., "1"). For example, there may be generated a bit of the candidate data existing at the same location as the selected bit of the program data.

In some embodiments, if the selected bit is determined to be identical with the previous bit, a bit of the candidate bit can be generated to have a logic high value (e.g., "1"). If the selected bit is determined to be different from the previous bit, a bit of the candidate bit can be generated to have a logic low value (e.g., "0").

In operation S350, a determination is made as to whether the selected bit is a last bit. For example, the selected bit of the program data may be determined to be a last bit of the program data. If the selected bit is not a last bit, the method proceeds to operation S230.

If the selected bit is a last bit, in operations S360 to S380, encoded data may be selected and flag data is generated. Operations S360 to S380 are performed the same as operations S230 to 250 of FIG. 6, and a description thereof is thus omitted.

FIG. 9 is a diagram illustrating an application of the method of FIG. 8, according to an embodiment of the inventive concept.

Referring to FIG. 9, because a first bit of program data is "1", a first bit of candidate data is generated as "1". A second bit of program data is "0" and is different from the first bit. Thus, a second bit of candidate data is generated as "1". Likewise, two continuous bits of the program data are compared, and the candidate data is generated according to a comparison result.

Flag data indicating that the program data is selected as encoded data may have a value of "0". Flag data indicating that the candidate data is selected as encoded data may have a value of "1".

A distance between the program data and read data is 6. A distance between the candidate data and the read data is 1. Thus, the candidate data is selected, and flag data having a value of "1" is generated.

Figure 10:
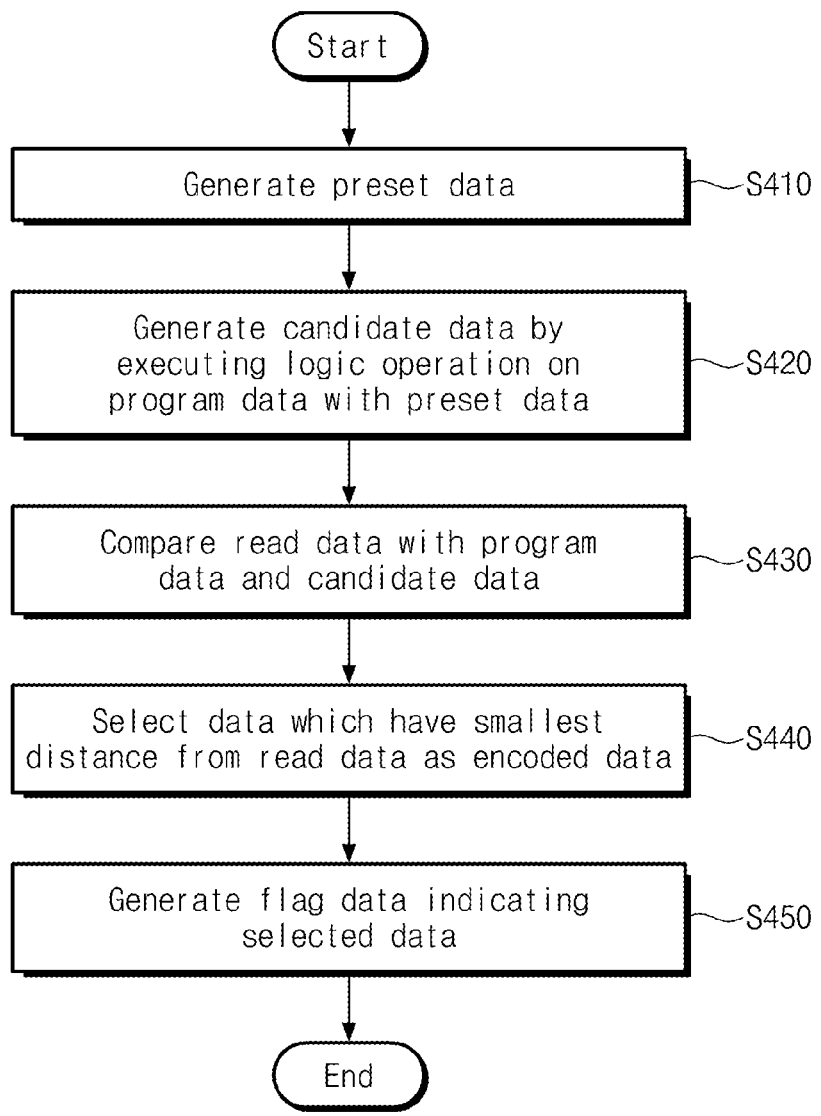
FIG. 10 is a flowchart illustrating still another method of programming a nonvolatile memory device in which encoding is performed and flag data is generated, according to an embodiment of the inventive concept.

FIG. 10 is a flowchart illustrating a method of programming a nonvolatile memory device in which encoding is performed and flag data is generated, according to an embodiment of the inventive concept. The encoding illustrated in FIG. 10 is binary mask encoding.

Referring to FIG. 10, in operation 5410, preset data is generated. The preset data can be previously stored in controller 1200. The preset data can be set via a mode register of controller 1200. Controller 1200 stores multiple data to select one of the data as the preset data. The length of the preset data is identical to that of program data.

In operation S420, candidate data is generated by executing a logic operation on the program data and the preset data. For example, an exclusive AND operation on the preset data of the program data is performed, and a resultant value is generated as the candidate data.

In operations S430 to S450, encoded data is selected and flag data is generated. Operations S430 to S450 are performed the same as operations S230 to 250 of FIG. 6, and a description thereof is thus omitted.

FIG. 11 is a diagram illustrating an application of an encoding method of FIG. 10.

Referring to FIG. 11, a result of an exclusive AND operation between program data and preset data is generated as candidate data. Flag data indicating that the program data is selected as encoded data may have a value of "0". Flag data indicating that the candidate data is selected as encoded data may have a value of "1".

A distance between the program data and read data is 6. A distance between the candidate data and read data is 4. Thus, the candidate data is selected as encoded data and flag data having a value of "1" is generated. In certain embodiments, the preset data is selected from multiple data sets. In this case, flag data may further include information indicating whether any one of the data sets is selected as the preset data.

FIG. 12 is a flowchart illustrating a method of programming a nonvolatile memory device in which encoding is performed and flag data is generated, according to an embodiment of the inventive concept. The encoding illustrating in FIG. 12 is bit reverse encoding.

Referring to FIG. 12, in operation S510, candidate data is generated by reversing program data. In operations S520 to S540, encoded data is selected and flag data is generated. Operations S520 to S540 are performed the same as operations S230 to 250 of FIG. 6, and a description thereof is thus omitted.

FIG. 13A is a diagram illustrating an application of the method of FIG. 12, according to an embodiment of the inventive concept. In the example of FIG. 13A, candidate data is generated by reversing program data. Flag data indicating that the program data is selected as encoded data has a value of "0". Flag data indicating that the candidate data is selected as encoded data has a value of "1". A distance between the program data and read data is 6. A distance between the candidate data and the read data is 2. Thus, the candidate data is selected, and flag data having a value of "1" is generated.

FIG. 13B is a diagram illustrating another application of the method of FIG. 12, according to an embodiment of the inventive concept. In the example of FIG. 13B, program data is divided into multiple portions and each of the portions is selectively reversed. The program data is 8-bit data and divided into two portions.

First candidate data is generated by reversing a first portion of the program data. Second candidate data is generated by reversing a second portion of the program data. Third candidate data is generated by reversing the first and second portions of the program data.

Flag data indicating that the program data is selected as encoded data is "00". Flag data indicating that the first candidate data is selected as encoded data is "01". Flag data indicating that the second candidate data is selected as encoded data is "10". Flag data indicating that the third candidate data is selected as encoded data is "11".

A distance between the program data and read data is 6. A distance between the first candidate data and the read data is 6. A distance between the second candidate data and the read data is 2. A distance between the third candidate data and the read data is 2. Thus, one of the second and third candidate data is selected as encoded data, and flag data having a value of "10" or "11" is generated.

Figure 14:
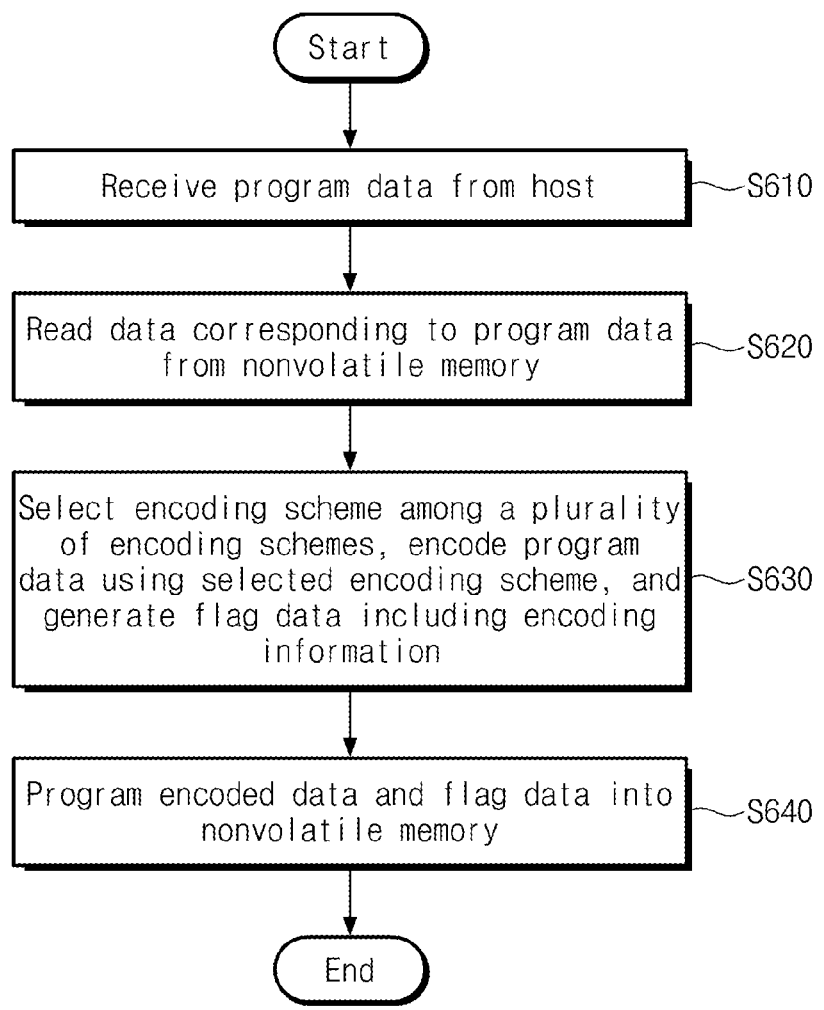
FIG. 14 is a flowchart illustrating a method of programming a nonvolatile memory device, according to another embodiment of the inventive concept.

FIG. 14 is a flowchart illustrating a method of programming a nonvolatile memory device according to another embodiment of the inventive concept.

Referring to FIG. 14, in operation S610, program data is received. In operation S620, data corresponding to the program data is read. Operations S610 and S620 are performed the same as operations S110 and S120 of FIG. 5.

In operation S630, one of multiple encoding schemes is selected, the program data is encoded using the selected encoding scheme, and flag data including encoding information is generated. In operation S640, the encoded data and the flag data is programmed at a nonvolatile memory 1100. In some embodiments, the encoding schemes are stored in data encoding/decoding unit 1260, and selection of an encoding scheme is performed by data encoding/decoding unit 1260.

Figure 15:
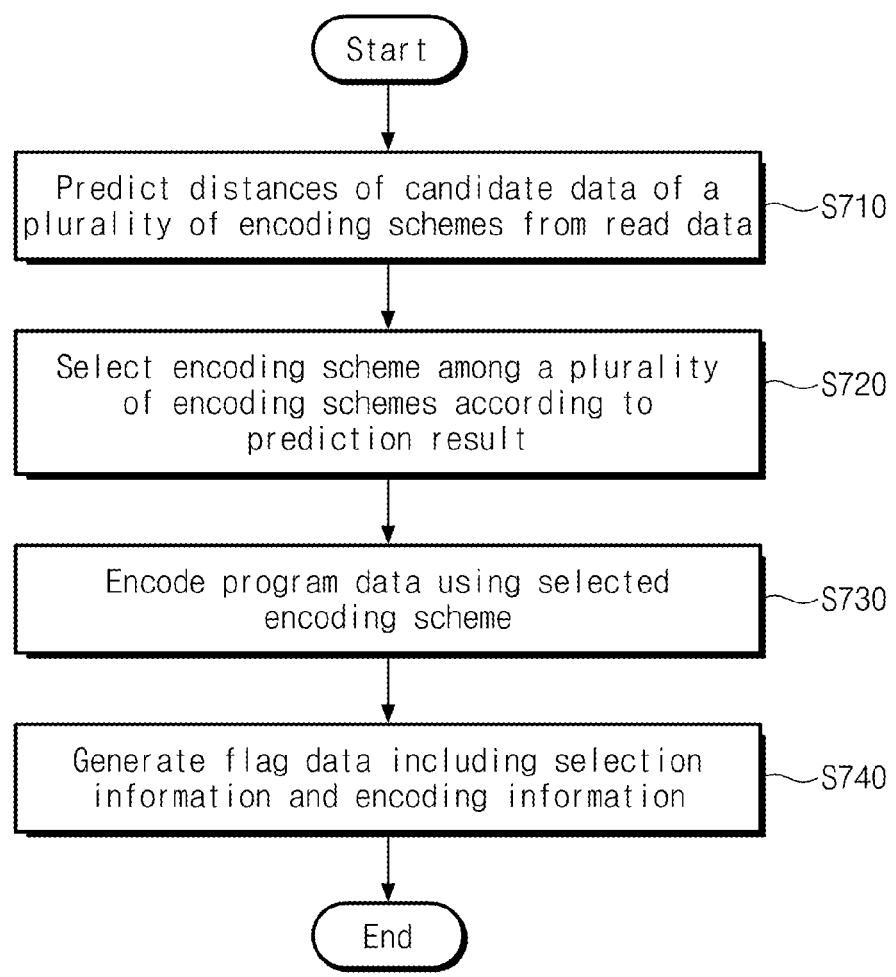
FIG. 15 is a flowchart illustrating a method of programming a nonvolatile memory device in which an encoding scheme is selected, encoding is performed, and flag data is generated, according to an embodiment of the inventive concept.

FIG. 15 is a flowchart illustrating a method of programming a nonvolatile memory device in which an encoding scheme is selected, encoding is performed, and flag data is generated, according to an embodiment of the inventive concept.

Referring to FIG. 15, in operation S710, there is predicted distances between candidate data of plural encoding schemes and read data. Predicting of the distance is performed by calculating factors (hereinafter, referred to as distance factors) influencing the distance. Predicting of the distance may include an operation of directly calculating a predicted distance. Predicting of the distance may include an operation of calculating the distance factors. Predicting of the distance is exemplarily used to express the inventive concept. The inventive concept may not be limited to direct predicting of the distance.

In operation S720, one of the plural encoding schemes is selected according to a prediction result. For example, there is selected an encoding scheme which is expected to generate candidate data having the smallest distance from the read data. In operation S730, the program data is encoded using the selected encoding scheme. In operation S740, flag data including selection information and encoding information is generated. The selection information may include information indicating whether any one of the encoding schemes is selected.

Figure 16:
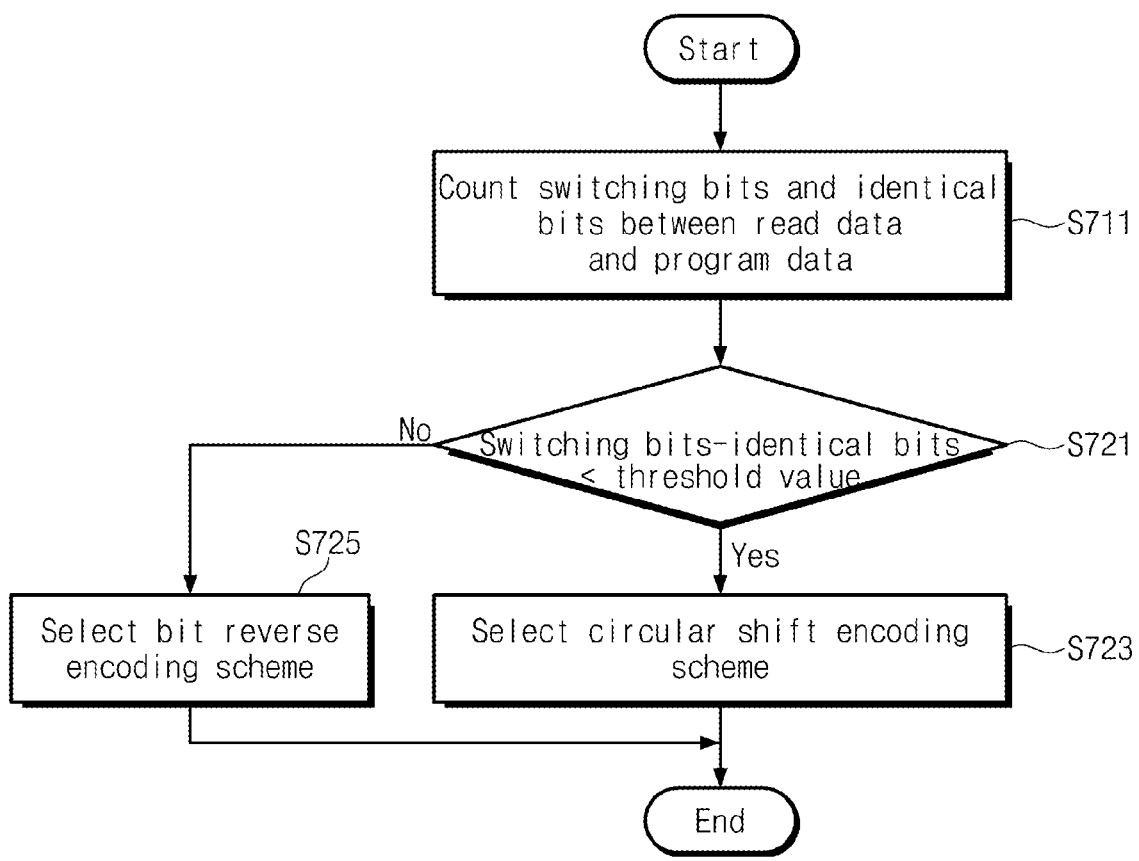
FIG. 16 is a flowchart illustrating a method of programming a nonvolatile memory device in which a distance of candidate data from read data is predicted and an encoding scheme is selected according to a prediction result, according to an embodiment of the inventive concept.

FIG. 16 is a flowchart illustrating an example in which a distance of candidate data from read data is predicted and an encoding scheme is selected according to a prediction result, according to an embodiment of the inventive concept.

Referring to FIG. 16, in operation S711, switching bits and identical bits between read data and program data are counted. The term "switching bit" refers to a bit that has a different value in the read data and program data, and the term "identical bit" refers to a bit that has the same value in the read data and the program data. This operation may correspond to an operation (an operation S710 in FIG.15)of predicting a distance between candidate and read data.

In some embodiments, where a difference between the switching bits and the identical bits is less than a threshold value, a distance between read data and candidate data generated according to a circular shift encoding scheme is predicted to be less than a distance between read data and candidate data generated according to a bit reverse encoding scheme. Where a difference between the switching bits and the identical bits is more than a threshold value, a distance between read data and candidate data generated according to the circular shift encoding scheme is predicted to be more than a distance between read data and candidate data generated according to the bit reverse encoding scheme.

In operation S721, it is determined whether a difference between a switching bit number and an identical bit number is less than a threshold value. If so, in operation S723, the circular shift encoding scheme is selected. If not, in operation S725, the bit reverse encoding scheme is selected.

The threshold value is a value previously stored in controller 1200. The threshold value is a value set via a mode register of controller 1200. The threshold value is set to half the length of program data.

Operations S721 to 725 may correspond to an operation (an operation S720 in FIG. 15) of selecting an encoding scheme according a prediction result.

Although the description of FIG. 16 relates to an example in which a data encoding/decoding unit 1260 including the circular shift encoding scheme and the bit revere encoding scheme selects an encoding scheme using a switching bit number and an identical bit number, the method is not limited to this example.

Data encoding/decoding unit 1260 can include at least two encoding schemes of a circular shift encoding scheme, a binary mask encoding scheme, a bit reverse encoding scheme, and so on. Data encoding/decoding unit 1260 can select an encoding scheme according to a calculation result of various distance factors such as switching and identical bit numbers, the transition number of program data bits, correlation between program data and read data, correlation between preset data for binary mask encoding and program data, the number of "1" or "0" bits of program data, and so on.

Figure 17:
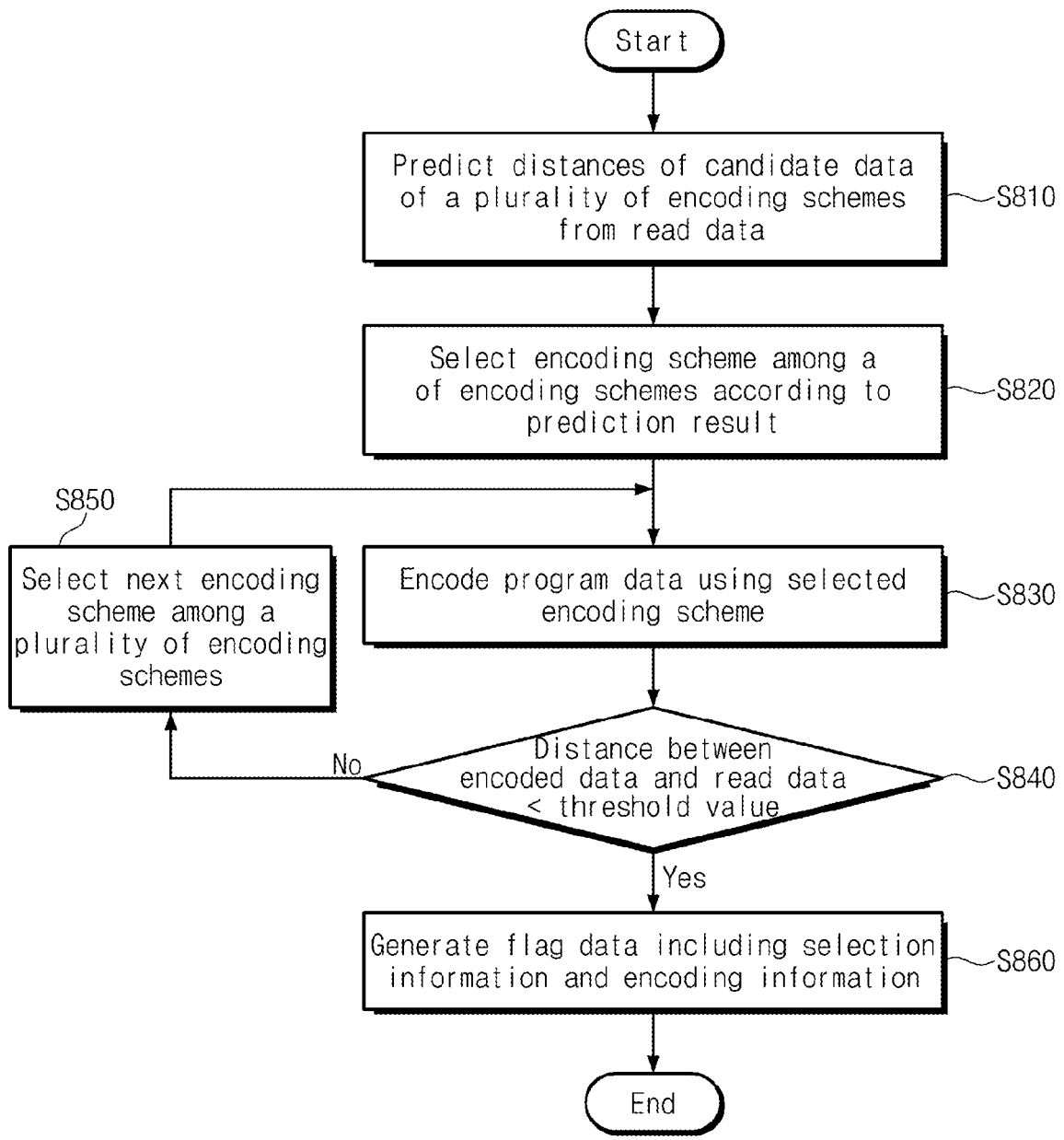
FIG. 17 is a flowchart illustrating a method of programming a nonvolatile memory device in which an encoding scheme is selected, encoding is performed, and flag data is generated, according to an embodiment of the inventive concept.

FIG. 17 is a flowchart illustrating a method of programming a nonvolatile memory device in which an encoding scheme is selected, encoding is performed, and flag data is generated, according to an embodiment of the inventive concept.

Referring to FIG. 17, in operations S810 and S820, one of multiple encoding schemes is selected according to a prediction result. Operations S810 and S820 are performed the same as operations S710 and S720 described with reference to FIG. 15.

In operation S830, program data is encoded using the selected encoding scheme. In operation S840, it is determined whether a distance between encoded data and read data is less than a threshold value. If the distance between the encoded data and the read data is more than the threshold value, in operation S850, a next encoding scheme of the encoding schemes is selected. For example, there is selected an encoding scheme which is predicted to generate candidate data having a next-nearest distance of the selected encoding scheme. Afterwards, the method proceeds to operation S830.

If the distance between the encoded data and the read data is less than the threshold value, in operation S860, flag information including selection information and encoding information is generated.

That is, although an encoding scheme is selected according to a prediction result, another encoding scheme may be selected when an encoding result of the selected encoding scheme does not satisfy a specific condition (e.g., a threshold value). In certain embodiments, the threshold value is set by a ratio on a distance between program data and read data. The threshold value can be set by a ratio on the number of all bits of the program data.

Figure 18:
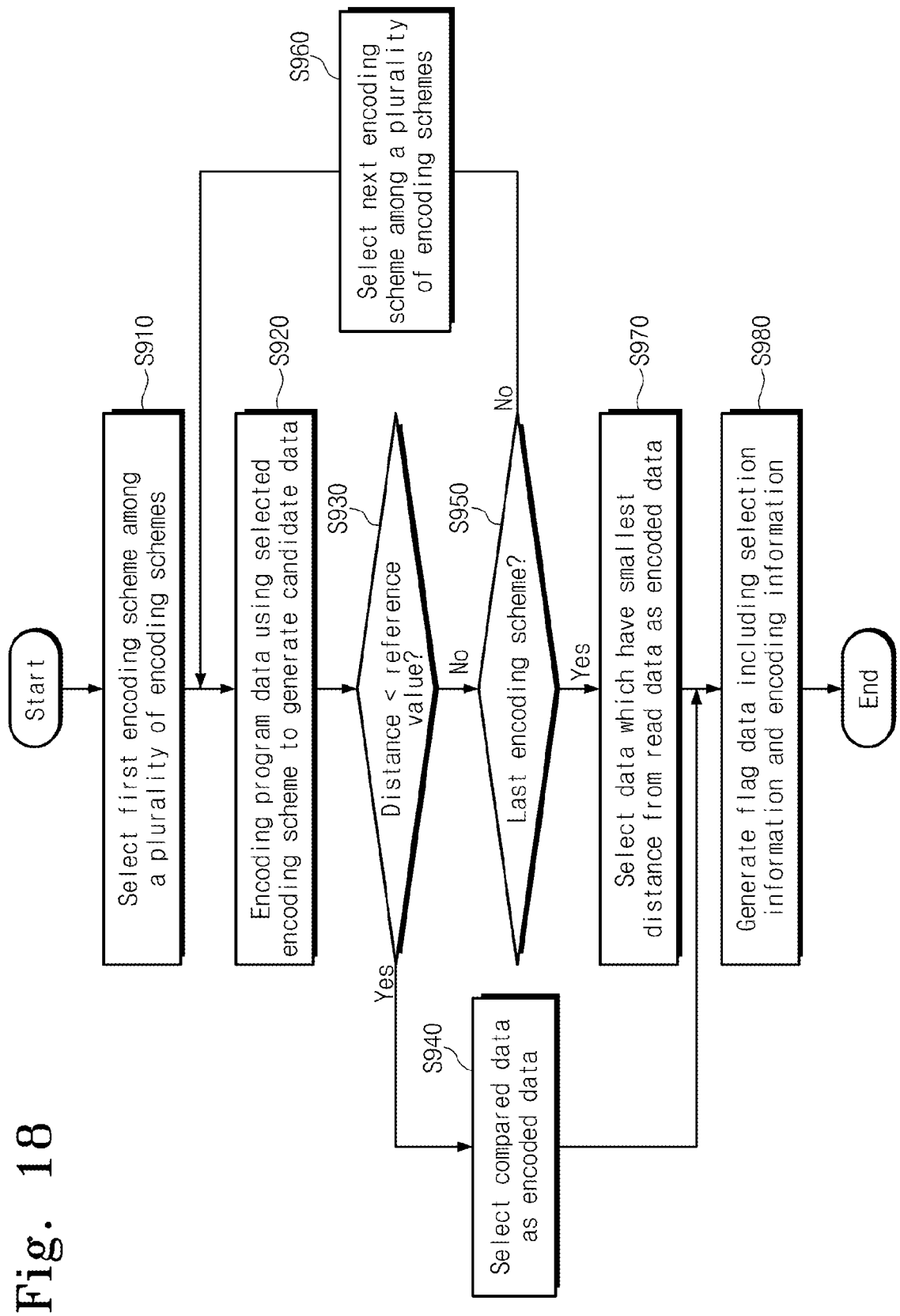
FIG. 18 is a flowchart illustrating a method of programming a nonvolatile memory device in which an encoding scheme is selected, encoding is performed, and flag data is generated, according to an embodiment of the inventive concept.

FIG. 18 is a flowchart illustrating a method of programming a nonvolatile memory device in which an encoding scheme is selected, encoding is performed, and flag data is generated, according to an embodiment of the inventive concept.

Referring to FIG. 18, in operation S910, a first encoding scheme of multiple encoding schemes is selected. In operation S920, candidate data is generated by encoding program data using the selected encoding scheme. In operation S930, it is determined whether a distance is less than a reference value. For example, it may be determined whether a distance between read data and candidate data is less than the reference value. If the distance is less than the reference value, in operation S940, the candidate data compared is selected as encoded data. Afterwards, the method proceeds to operation S980. If the distance is not less than the reference value, the method proceeds to operation S950.

In operation S930, it is determined whether the selected encoding scheme is a last encoding scheme. If the selected encoding scheme is not the last encoding scheme, in operation S960, a next encoding scheme of the encoding schemes is selected. Afterwards, the method proceeds to operation S920. If the selected encoding scheme is the last encoding scheme, the method proceeds to operation S970.

In operation S970, data having the smallest distance from the read data is selected as encoded data. In operation S980, flag data including selection information and encoding information is generated.

As indicated by the foregoing, program data is sequentially encoded using multiple encoding schemes, and data having the smallest distance is selected as encoded data according to encoding results.

Figure 19:
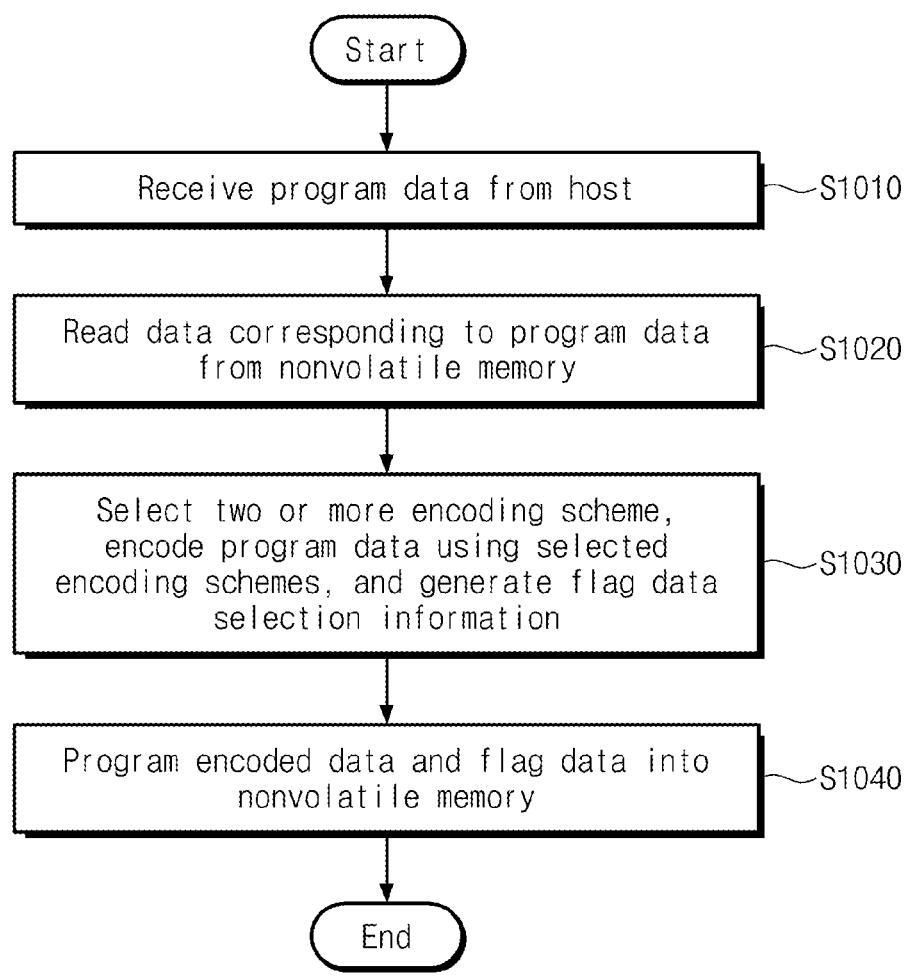
FIG. 19 is a flowchart illustrating a method of programming a nonvolatile memory device, according to an embodiment of the inventive concept.

FIG. 19 is a flowchart illustrating a method of programming a nonvolatile memory device according to an embodiment of the inventive concept.

Referring to FIG. 19, in operation S1010, program data is received. In operation S1020, data corresponding to the program data is read from nonvolatile memory 1100. Operations S1010 and S1020 are performed the same as operations S110 and S120 described with reference to FIG. 5.

In operation S1030, two or more encoding schemes of multiple encoding schemes are selected, the program data is encoded using the selected encoding schemes, and flag data including selection information and encoding information is generated.

In some embodiments, a bit reverse encoding scheme and a circular shift encoding scheme are selected. In this case, first encoding on the program data is performed according to the bit reverse encoding scheme. Afterwards, second encoding on first encoded data is performed according to the circular shift encoding scheme. This embodiment is described using the bit reverse encoding scheme and the circular shift encoding scheme. However, the inventive concept is not limited thereto.

In operation S1040, the encoded data and the flag data are programmed at nonvolatile memory 1100.

In certain embodiments, a data encoding/decoding unit 1260 may select two or more encoding schemes and a combination thereof. As described with reference to FIGS. 15 to 17, data encoding/decoding unit 1260 selects encoding schemes according to a prediction result (or, a calculation result of distance factors). As described with reference to FIG. 18, data encoding/decoding unit 1260 performs encoding via sequential selecting and combining of multiple encoding schemes and select encoded data according to encoding results.

In some embodiments, where data encoding/decoding unit 1260 selects a circular shift encoding scheme and a bit reverse encoding scheme, one of program data, bit reverse encoded data, 1-bit circular shift encoded data, 2-bit circular shift encoded data, 3-bit circular shift encoded data, 1-bit circular shift and bit reverse encoded data, 2-bit circular shift and bit reverse encoded data, and 3-bit circular shift and bit reverse encoded data is selected as encoded data.

Figure 20:
FIG. 20 is a diagram illustrating a method of programming a nonvolatile memory device in which a data encoding and decoding unit divides program data and decodes divided portions of the program data, according to an embodiment of the inventive concept.

FIG. 20 is a diagram illustrating an example in which a data encoding and decoding unit divides program data and decodes divided portions of the program data, according to an embodiment of the inventive concept.

Referring to FIG. 20, data encoding/decoding unit 1260 divides program data into multiple portions and encodes the portions of the program data. For example, data encoding/decoding unit 1260 may apply the same encoding scheme to portions of the program data. One of a circular shift encoding scheme, a differential encoding scheme, a binary mask encoding scheme, and a bit reverse encoding scheme is applied to the portions of the program data. Flag data comprises information about a selected encoding scheme.

For example, data encoding/decoding unit 1260 may apply independent encoding schemes to the portions of the program data, respectively. A first portion of the program data is 1-bit circular shift encoded, a second portion of the program data is 3-bit circular shift encoded, a third portion of the program data is original data, and a fourth portion of the program data is bit reverse encoded. Flag data comprises information about encoding schemes respectively applied to portions of the program data. If the program data is divided and encoded, a distance between encoded data and read data may be further reduced.

Figure 21:
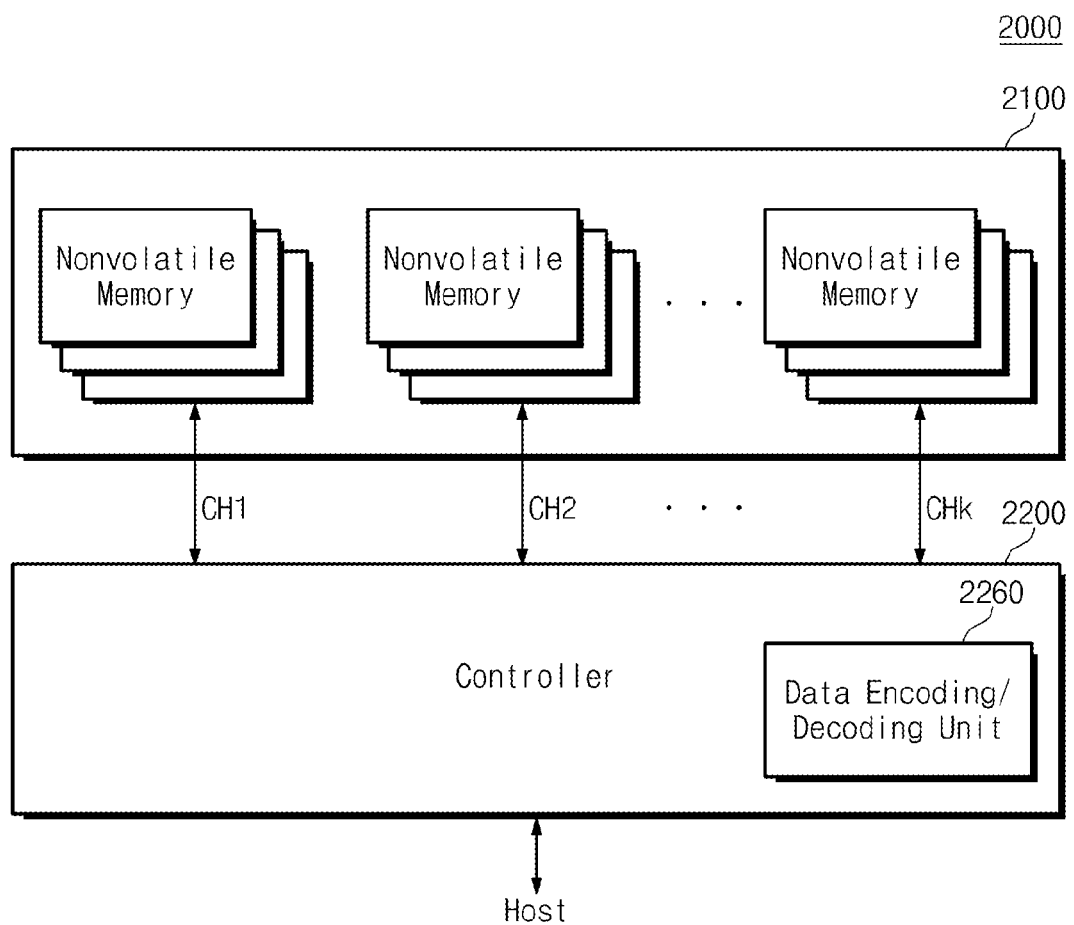
FIG. 21 is a block diagram illustrating a memory system, according to another embodiment of the inventive concept.

FIG. 21 is a block diagram illustrating a memory system according to another embodiment of the inventive concept.

Referring to FIG. 21, a memory system 2000 comprises a nonvolatile memory 2100 and a controller 2200.

Nonvolatile memory 2100 comprises multiple nonvolatile memory chips divided into multiple groups. Nonvolatile memory chips in each group communicate with controller 2200 via a common channel. In example embodiments, the nonvolatile memory chips may communicate with controller 2200 via multiple channels CH1 to CHk.

Controller 2200 comprises a data encoding and decoding unit 2260. Data encoding and decoding unit 2260 performs encoding and generating of flag data according to a manner described with reference to FIGS. 5 to 20.

Figure 22:
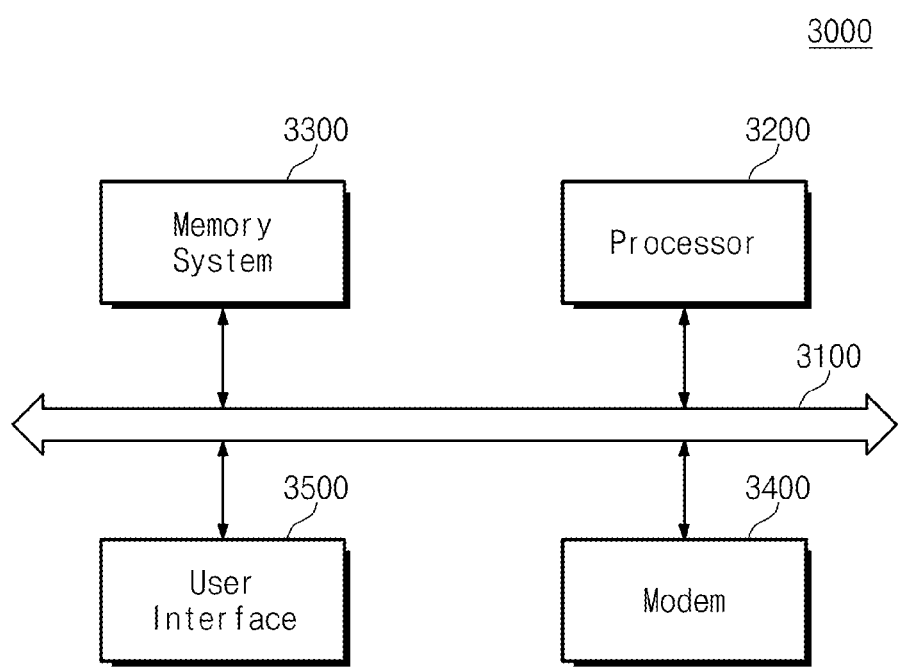
FIG. 22 is a block diagram illustrating a computing system, according to an embodiment of the inventive concept.

FIG. 22 is a block diagram illustrating a computing system according to an embodiment of the inventive concept.

Referring to FIG. 22, a computing system 3000 comprises a bus 3100, a processor 3200, a memory system 3300, a modem 3400, and a user interface 3500. Bus 3100 provides channels between components of computing system 3000. Processor 3200 controls an overall operation of computing system 3000 and performs a logical operation. Memory system 3300 comprises a memory system 1000 or 2000 according to an embodiment of the inventive concept. Memory system 3300 can be used as a working memory or storage of computing system 3000. The working memory is a storage space which processor 3200 uses to control computing system 3000. The storage is a storage space which computing system 3000 uses to retain data in the long term.

Where memory system 3300 is used as the working memory, computing system 3000 may further comprise separate storage. On the other hand, where memory system 3300 is used as the storage, computing system 3000 may further include a separate working memory. Modem 3400 performs wire or wireless communications with an external device.

User interface 3500 may include user input interfaces such as a camera, a keyboard, a mouse, a microphone, a touch pad, a touch panel, a button, a sensor, and so on and user output interfaces such as a display, a speaker, a ramp, a motor, and so on.

Computing system 3000 may be mobile multimedia devices such as a smart phone, a smart pad, and so on or multimedia devices such as a smart television, a smart monitor, a computer, a notebook computer, and so on.

As indicated by the foregoing, in various embodiments of inventive concept, program data is encoded to data having a smallest distance from data stored at a nonvolatile memory and then programmed. Because the number of bits switched at programming is reduced, power consumption of the nonvolatile memory may be reduced.

The foregoing is illustrative of embodiments and is not to be construed as limiting thereof. Although a few embodiments have been described, those skilled in the art will readily appreciate that many modifications are possible in the embodiments without departing from scope of the inventive concept as defined in the claims.

What is claimed is:

1. A method of programming data in a nonvolatile memory device, comprising:
    receiving program data to be programmed in selected memory cells of the nonvolatile memory device;
    reading data from the selected memory cells;
    selecting at least one encoding scheme from among multiple encoding schemes according to a comparison of the program data and the read data;
    encoding the program data using the at least one encoding scheme selected from among the multiple encoding schemes;
    generating flag data including encoding information; and
    programming the encoded program data and the flag data in the selected memory cells, wherein the encoding schemes comprise a circular shift encoding scheme and a reverse encoding scheme, and wherein selecting the at least one of the encoding schemes comprises:

shifting the program data using the circular shift encoding scheme where a difference between switching bits and identical bits is below a threshold value and reversing the program data using the reverse encoding scheme where a difference between the switching bits and the identical bits is above the threshold value.

2. The method of claim 1, wherein selecting the at least one encoding scheme comprises:

predicting encoding results of the encoding schemes; and selecting the at least one encoding scheme according to a result of the prediction.

3. The method of claim 2, wherein predicting the encoding results comprises counting the identical bits and the switching bits between the read data and the program data.

4. The method of claim 2, further comprising:

generating flag data comprising the encoding information where a distance between the encoded data and the read data is below a threshold value;

selecting another encoding scheme among the encoding schemes according to the prediction result where a distance between the encoded data and the read data is over the threshold value;

encoding the program data using the another selected encoding scheme; and generating the flag data.

5. The method of claim 1, wherein encoding the program data and generating the flag data comprises:

generating candidate data by sequentially selecting the encoding schemes and encoding the program data using the sequentially selected encoding schemes;

comparing the read data with the program data and the candidate data, respectively;

selecting data having the smallest distance from the read data from among the program data and the candidate data as the encoded data; and generating flag data including the encoding information.

6. The method of claim 1, wherein encoding the program data and generating flag data comprises:

selecting two or more encoding schemes;

encoding the program data using a combination of the two or more encoding schemes selected; and generating flag data including the encoding information.

7. The method of claim 1, wherein the encoding information comprises information about data selected as the encoded data from among the program data and candidate data generated by the at least one encoding scheme.

8. The method of claim 1, wherein the circular shift encoding scheme generates candidate data via circular shift of the program data and the flag data includes information about the number of bits of the encoded data circular shifted from the program data.

9. The method of claim 1, wherein the encoding schemes further comprise a differential encoding scheme that generates candidate data having a first bit identical with a first bit of the program data, logic high values at locations where bits of the program data transition, and logic low values at locations where bits of the program data do not transition and the flag data comprises information about data, selected as the encoded data, from among the program data and the candidate data.

10. The method of claim 1, wherein the encoding schemes further comprise a binary mask encoding scheme that generates candidate data by performing a logical operation on preset data and the program data and the flag data includes information about data, selected as the encoded data, from among the program data and the candidate data.

11. The method of claim 1, wherein the reverse encoding scheme generates candidate data by reversing the program data and the flag data comprises information about data, selected as the encoded data, from among the program data and the candidate data.

12. The method of claim 1, wherein the program data is divided into multiple sub data, the at least one encoding scheme is selected to each of the sub data.

13. A method of programming a memory, comprising:

receiving program data to be programmed in selected memory cells of the memory;

reading data from the selected memory cells;

dividing the program data into multiple program data portions and the read data into multiple read data portions;

selecting at least one encoding scheme from among multiple encoding schemes according to a comparison between each program data portion and a corresponding read data portion;

encoding each of the program data portions using the at least one encoding scheme selected from among the multiple encoding schemes;

generating encoded data by combining the encoded program data portions;

generating flag data comprising encoding information for each of the program data portions; and programming the encoded data and the flag data in the selected memory cells, wherein the multiple encoding schemes comprise a circular shift encoding scheme which shifts bits of at least a portion of the program data and a reverse encoding scheme which shifts bits of at least a portion of the program data.

14. The method of claim 13, wherein the comparison comprises determining switching bits and identical bits between each program data portion and the corresponding read data portion.

15. The method of claim 13, wherein the encoding scheme is selected for each program data portion according to whether a distance between the program data portion and the corresponding read data portion is greater than a predetermined threshold.

16. The method of claim 13, wherein selecting the at least one of the encoding schemes comprises:

selecting the circular shift encoding scheme when a difference between switching bits and identical bits between the read data and the program data is below a threshold value and selecting the reverse encoding scheme when a difference between the switching bits and the identical bits is above the threshold value.

17. A method of programming a memory, comprising:

receiving program data to be programmed in selected memory cells;

reading data from the selected memory cells;

selecting the program data as candidate data;

comparing the read data with the candidate data;

based on the comparison, selecting the candidate data as encoded data where a distance between the candidate data and the read data is less than a reference value, generating additional candidate data via circular shift of the candidate data where a distance between the candidate data and the read data is greater than the reference value, and again performing the comparing and selecting of the candidate data as the encoded data or the generating of the additional candidate data according to the comparison;

generating flag data comprising information about the number of bits of the encoded data shifted from the program data; and programming the encoded data and the flag data at the memory cells of the memory.

18. The method of claim 17, wherein if the again performing is performed a predetermined number of times without selection of the encoded data, data having a smallest distance from the read data among the program data and the candidate data generated by the circular shift is selected as the encoded data.

19. The method of claim 17, wherein the comparison comprises determining switching bits and identical bits between the program data and the candidate data.

20. The method of claim 17, wherein programming the encoded data comprises retaining, in the selected memory cells, bits of the read data that are the same as corresponding bits of the encoded data.

21. The method of claim 17, wherein the memory is a phase change random access memory.

22. A memory system comprising:
a memory; and
a controller configured to control the memory;
wherein the controller comprises:
    a random access memory;
    a host interface configured to receive program data from an external device and to store the program data at the random access memory;
    a memory interface configured to receive data read from the memory and to store the read data at the random access memory;
    a data encoding unit configured to encode the program data stored at the random access memory based on the read data stored at the random access memory and to store the encoded data at the random access memory; and
    a processor configured to control the memory interface to program the encoded data of the random access memory at the memory,
    wherein the data encoding unit is further configured to select at least one encoding scheme from among multiple encoding schemes according to a comparison between the read data and the program data and generate the encoded data according to the at least one encoding scheme, and
    wherein the encoding schemes comprise a circular shift encoding scheme which shifts bits of at least a portion of the program data and a reverse encoding scheme which shifts bits of at least a portion of the program data.

23. The memory system of claim 22, wherein the memory comprises a magnetic random access memory.

24. The memory system of claim 22, wherein the memory comprises a phase change random access memory.

25. The memory system of claim 22, wherein the comparison comprises determining switching bits and identical bits between the program data and the read data.

26. The method of claim 22, wherein the data encoding unit is further configured to select the circular shift encoding scheme when a difference between switching bits and identical bits between the read data and the program data is below a threshold value and select the reverse encoding scheme when a difference between the switching bits and the identical bits is above the threshold value.

27. A method of programming a memory, comprising:
receiving program data to be programmed in selected memory cells;
reading data from the selected memory cells;
dividing the program data into first and second portions;
selecting a first encoding scheme from among multiple encoding schemes;
generating first candidate data by encoding the first portion of the program data using the first encoding scheme;
selecting a second encoding scheme from among the multiple encoding schemes;
generating second candidate data by encoding the second portion of the program data using the second encoding scheme;
selecting a third encoding scheme from among the multiple encoding schemes;
generating third candidate data by encoding both the first portion and the second portion of the program data;
selecting data having a smallest distance from the read data as encoded data by selecting one among the first portion of the program data and the first candidate data and selecting another one among the second portion of the program data and the second candidate data;
generating flag data comprising information about the encoded data; and
programming the encoded data and the flag data in the selected memory cells.

28. The method of claim 27, wherein the smallest distance is defined according to a number of switching bits between the read data and a combination of the selected one and the selected another one.

29. The method of claim 27, wherein the memory comprises a magnetic random access memory or a phase change random access memory.

30. The method of claim 27, wherein selecting the first encoding schemes comprises:
selecting a circular shift encoding scheme when a difference between switching bits and identical bits between a first portion of the read data and the first portion of the program data is below a first threshold value and selecting a reverse encoding scheme when a difference between the switching bits and the identical bits is above the first threshold value,
wherein selecting the second encoding schemes comprises:
selecting the circular shift encoding scheme when a difference between switching bits and identical bits between a second portion of the read data and the second portion of the program data is below a second threshold value and selecting the reverse encoding scheme when a difference between the switching bits and the identical bits is above the second threshold value,
wherein selecting the third encoding schemes comprises:
selecting the circular shift encoding scheme when a difference between switching bits and identical bits between the read data and the program data is below a third threshold value and selecting the reverse encoding scheme when a difference between the switching bits and the identical bits is above the third threshold value.

* * * * *